(12) United States Patent
Gangopadhyay et al.

(10) Patent No.: US 8,470,459 B2
(45) Date of Patent: Jun. 25, 2013

(54) NANOCOMPOSITE DIELECTRIC COATINGS

(75) Inventors: Shubhra Gangopadhyay, Columbia, MO (US); Maruf Hossain, Columbia, MO (US); Keshab Gangapadhyay, Columbia, MO (US)

(73) Assignee: The Curators of the University of Missouri, Columbia, MO (US)

( * ) Notice: Subject to any disclaimer, the term of this patent is extended or adjusted under 35 U.S.C. 154(b) by 247 days.

(21) Appl. No.: 12/410,988

(22) Filed: Mar. 25, 2009

(65) Prior Publication Data

US 2009/0263647 A1    Oct. 22, 2009

Related U.S. Application Data

(60) Provisional application No. 61/039,288, filed on Mar. 25, 2008.

(51) Int. Cl.
   *B32B 7/02*   (2006.01)
   *B32B 5/16*   (2006.01)
   *B32B 9/00*   (2006.01)
   *B32B 9/04*   (2006.01)
   *B32B 13/04*  (2006.01)
   *B32B 19/00*  (2006.01)

(52) U.S. Cl.
   USPC ........... 428/701; 428/216; 428/323; 428/335; 428/446; 428/698

(58) Field of Classification Search
   USPC .......... 428/216, 323, 335, 446, 698, 701
   See application file for complete search history.

(56) References Cited

U.S. PATENT DOCUMENTS

| 6,624,088 | B2 * | 9/2003 | Moore ........................ 438/756 |
| 6,713,176 | B2 | 3/2004 | Yadav et al. |
| 6,896,968 | B2 * | 5/2005 | Golecki ........................ 428/446 |
| 2007/0122101 | A1 | 5/2007 | Buretea et al. |
| 2007/0122545 | A1 | 5/2007 | Kunitake et al. |
| 2008/0038484 | A1 | 2/2008 | Alcott et al. |

OTHER PUBLICATIONS

Schiavon et al. ("Glasses in the Si-O-C-N system produced by pyrolysis of polycyclic silazane/siloxane networks", Journal of Non-Crystalline Solids, vol. 353, 2007, pp. 2280-2288.*
Cross et al., "Synthesis and Tribological behavious of Silicon Oxycarbonitride Thin Filsm derived from Poly(urea)Methyl Vinyl Silazane", International Journal of Applied Ceramic Technology, vol. 3, No. 2, 2006, pp. 113-126.*
International Search Report for PCT/US09/38225; dated May 11, 2009; 8 pages.

* cited by examiner

*Primary Examiner* — Jonathan Langman
(74) *Attorney, Agent, or Firm* — Polsinelli PC

(57) ABSTRACT

The present invention describes processes for coating substrates with a nanocomposite SiCON material. In addition, the present invention describes the dielectric nanocomposite coatings.

10 Claims, 19 Drawing Sheets

NANOCOMPOSITE DIELECTRIC COATINGS

CROSS REFERENCE TO RELATED APPLICATION

This application claims priority from U.S. provisional patent application Ser. No. 61/039,288, entitled "Nanocomposite Dielectric Coatings" filed on Mar. 25, 2008, which is hereby incorporated by reference in its entirety.

FIELD OF THE INVENTION

The present invention relates to processes for coating substrates with a SiCON nanocomposite material. The present invention also relates to dielectric nanocomposite coatings.

BACKGROUND OF THE INVENTION

Thin coatings or films are used for a variety of applications, depending on the coating's mechanical, chemical, optical and electrical properties. High strength, scratch-resistant coatings are highly desirable for any application in which the surface condition is critical to the performance of the device, such as optical components, surgical instruments, and small-scale electrical components. A hydrophobic or hydrophilic coating may be highly desirable for applications in which the device may operate in an aqueous environment such as surgical instruments, or for applications in which it is desired to make the device water repellent, such as electrical devices or vehicle windshields. Anti-reflective coatings are routinely used in many optical devices, and thin fluorescent coatings have many useful applications, such as light-emitting diodes. Thin films with high dielectric constants are routinely used in the fabrication of extremely small-scale semiconductor devices and capacitors as well as electrical surgical instruments.

Various vapor deposition techniques are routinely used to deposit thin layers of material on a variety of substrates, including chemical vapor deposition (CVD) and, more commonly, plasma enhanced chemical vapor deposition (PECVD). Plasma enhanced chemical vapor deposition is a method in which a substrate is placed within a deposition chamber in which two or more reactants in a gaseous phase are injected between two electrical plates powered by radio frequency AC power. The power induces the ionization of the reactants, causing them to react and form new products. The reaction products then accumulate as a solid phase layer on the surface of the substrate. PECVD is especially useful in the fabrication of small-scale electrical devices because the pattern of deposition can be readily controlled with relatively simple masking materials and methods.

Silicon (Si) and silicon-containing compounds are widely used to fabricate coatings on devices using PECVD methods. Crystalline silicon carbide (SiC) is one of the most versatile materials for fabricating electronic devices but requires temperatures of over 1000° C. for fabricating electronic devices. SiC can also be deposited in amorphous or nano-crystalline forms at temperatures as low as 400° C., while retaining useful dielectric properties. Silicon oxide ($SiO_2$) is another material that may be deposited at temperatures as low as 400° C. The lower fabrication temperature makes it possible to deposit the coatings on a wider variety of substrates. Even at 400° C., however, the fabrication temperature may preclude the use of plastic substrates, which melt at temperatures around 200° C. Further, in each of these materials, a tradeoff occurs between the various properties of the coating materials. Crystalline SiC is nearly as hard as diamond, but has a lower capacity to store electrical charge than the other coatings such as amorphous SiC and $SiO_2$. Amorphous SiC and $SiO_2$ have more desirable electrical properties than crystalline SiC, but at the expense of reduced hardness. In addition, the coating materials discussed are limited to a total thickness of about 8 μm due to the cracking and delamination of thicker coatings of these materials. This maximum thickness further limits the potential applications of these materials.

A need in the art exists for a coating material that combines in a single material the separate advantages of previous coating materials. A need exists for a coating material that can be deposited at temperatures as low as room temperature and at much higher thicknesses than existing coating materials. Further, a coating material is needed that simultaneously possesses high hardness values and high dielectric capacity. Lastly, a process of depositing a coating material is needed in which other useful properties such as hydrophobicity or fluorescence may be adjusted to desired levels, without sacrificing any of the other desirable properties of the coating material.

SUMMARY OF THE INVENTION

The present invention provides a nanocomposite coating material deposited on the surface of a substrate. The nanocomposite coating material includes nanostructures embedded in an amorphous silicon oxide matrix. The coating material includes a chemical composition $Si_xC_yO_zN$, where x ranges from about 0.25 to about 25, y ranges from about 0.25 to about 25, and z ranges from about 1.5 to about 40.

The present invention further provides a process for depositing a nanocomposite coating material on a substrate. The process includes adding gaseous reactants to a deposition chamber that contains at least one substrate. The process also includes creating an ionized state within the deposition chamber such that the reactants form a solid coating of SiCON that is deposited on the surface of the substrate. In addition, the solid coating includes essentially no hydrogen.

DETAILED DESCRIPTION OF THE INVENTION

Figure 1:
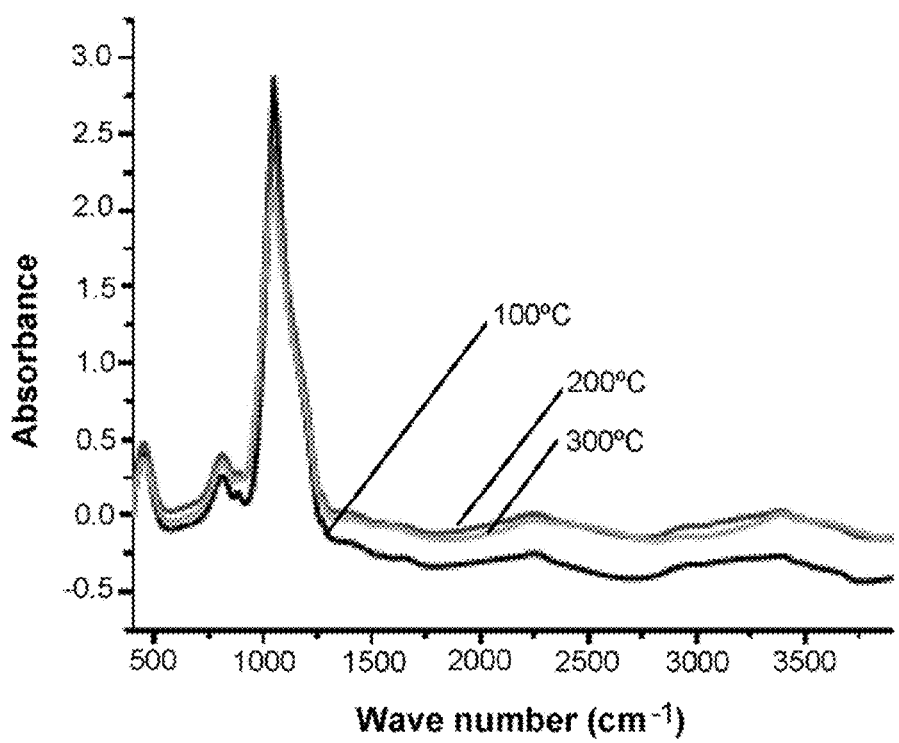
FIG. 1 depicts the Fourier transform infrared (FTIR) spectra of the SiCON coatings deposited at three different temperatures as a function of wave number.

The present invention provides a nanocomposite coating material comprising nanostructures embedded in an amorphous silicon oxide matrix. The nanostructures of the nanocomposite coating material include amorphous SiC, amorphous carbon, amorphous carbon nitride (CN), amorphous $SiO_2$, anocrystalline SiC, nanocrystalline carbon, nanocrystalline carbon nitride (CN), and combinations thereof. The nanocomposite coating material has the chemical composition SiCON, and generally may be applied to substrates at a relatively high thickness without cracking or delaminating. The nanocomposite coating material is typically non-porous and scratch-resistant. Further, the nanocomposite coating material generally has high breakdown field strength, and a dielectric constant of over 5.

The SiCON coating typically includes essentially no hydrogen, defined herein as including hydrogen in an amount less than about 1% of the total atoms of the coating. Without being bound to any particular theory, the absence of hydrogen in the coating is thought to enhance the electrical, mechanical and thermal properties of the SiCON coating. In addition, the non-porous SiCON coating is also thought to enhance the electrical properties of polymer coatings such as poly-paraxylene. Without being bound to any particular theory, the non-porous SiCON fills in the voids present in the porous polymer coatings that are thought to degrade the dielectric properties of the polymer material.

In one iteration of the invention, a process for depositing a nanocomposite coating material on a substrate at temperatures as low as 25° C. is provided. Because of the low temperature of deposition, the nanostructured coating material may be deposited on a wide variety of substrates, including plastics and other materials with melting points under 400° C. Alternatively, the process may be conducted at higher temperatures as described in detail below. The process of the invention generally includes placing a substrate in a deposition chamber at low pressure, and then introducing gaseous reactants in an ionized state to the deposition chamber, forming a solid coating comprising SiCON on the surface of the substrate. Many of the properties of the resulting nanocomposite coating material may be altered, including the coating's composition, surface roughness, hardness, surface affinity for water, dielectric constant, refractive index, breakdown field, and bandgap, by varying process conditions.

I. Substrate

One aspect of the invention provides a nanocomposite coating material deposited on a substrate. Generally, the substrate for the nanocomposite coating material may be a planar surface, a three-dimensional surface of arbitrary topography, or combinations thereof. The substrate may be porous or non-porous and may be made of a variety of known materials suitable for the intended use of the substrate.

In one embodiment, the substrate is a non-porous material selected from the group consisting of quartz, glass, silicon, stainless steel, plastic, aluminum, titanium, and germanium. In another embodiment, the substrate is one of a variety of porous matrices, including a hydrogel, a zeolite, an aerogel, a xerogel, an ambigel, a ceramic, or a polymer. The silica hydrogel or aerogel may be prepared by a variety of methods generally known in the art, such as by conventional base-catalyzed methods, by conventional acid-catalyzed methods or the substrates may be commercially purchased.

The substrate may also be a polymer, a copolymer, a terpolymer, or mixtures thereof. A variety of polymers are suitable for use in the process of the invention. The polymer may be derivatized with a halogen or other functional groups such as phosphates, carboxylates, silanes, siloxanes, and sulfides, including POOH, POSH, PSSH, OH, $SO_3H$, $SO_3R$, $SO_4R$, COOH, $NH_2$, NHR, $NR_2$, $CONH_2$, NH—$NH_2$, and others, where R may comprise any of aryl, alkyl, alkylene, siloxane, silane, ether, polyether, thioether, silylene, and silazane. Examples of other polymers are homopolymers or copolymers of vinyl, acrylate, methacrylate, vinyl aromatic, vinyl esters, alpha beta unsaturated acid esters, unsaturated carboxylic acid esters, vinyl chloride, vinylidene chloride, and diene monomers. Further examples of polymers include a hydrogen-containing fluoroelastomer, a hydrogen-containing perfluoroelastomer, a hydrogen-containing fluoroplastic, a perfluorothermoplastic, at least two different fluoropolymers, or a cross-linked halogenated polymer.

Other suitable polymers include poly[2,2-bistrifluoromethyl-4,5-difluoro-1,3-dioxole-co-tetrafluoroethylene], poly [2,2-bisperfluoroalkyl-4,5-difluoro-1,3-dioxole-co-tetrafluoroethylene], poly[2,3-(perfluoroalkenyl) perfluorotetrahydrofuran], poly[2,2,4-trifluoro-5-trifluoromethoxy-1,3-dioxole-co-tetrafluoroethylene], poly (pentafluorostyrene), fluorinated polyimide, fluorinated polymethylmethacrylate, polyfluoroacrylates, polyfluorostyrene, fluorinated polycarbonates, fluorinated poly (N-vinylcarbazole), fluorinated acrylonitrile-styrene copolymer, fluorinated Nafion®, fluorinated poly(phenylenevinylene), perfluoro-polycyclic polymers, polymers of fluorinated cyclic olefins, copolymers of fluorinated cyclic olefins, polymethylmethacrylates, polystyrenes, polycarbonates, polyimides, epoxy resins, cyclic olefin copolymers, cyclic olefin polymers, acrylate polymers, PET, polyphenylene vinylene, polyether ether ketone, poly (N-vinylcarbazole), acrylonitrile-styrene copolymer, poly(phenylenevinylene), poly(vinylalcohol), poly(vinylpyrrolidone), polymide, or poly-paraxylene.

The substrate may also be made of a silicon containing material including silicon dioxide, silicon carbide, and silicone carboxide. Other suitable substrates include aluminum oxide, gallium nitride, gallium arsenide, indium tin oxide, titanium oxide, lead oxide, lead sulfide, lead selenide, and lead telluride. In another embodiment, the substrate may be made of a material selected from the group consisting of a transition metal oxide, a lanthanide oxide, a transition metal chalcogenide, a transition metal chalcogenide alloy, a lanthanide chalcogenide, and mixtures thereof.

II. Coating Material

The coating material of the invention is typically a nanocomposite consisting of nanostructures embedded in an amorphous silicon oxide matrix, described in more detail below. The thickness of the coating material on the substrate can and will vary. In certain embodiments of the invention, the coating material is deposited on the substrate in a thin layer ranging from about 5 nm to about 50 µm. The deposition process, described in detail below, combines gaseous reactants under ionizing conditions, to yield the coating material in a single step. By varying the deposition process conditions, also described in detail below, the overall composition and corresponding properties of the nanocomposite coating may be specified.

A. Overall Composition

The nanocomposite coating material of the invention includes the elements silicon, carbon, oxygen, nitrogen, and trace amounts of hydrogen. Depending on the deposition process conditions, the relative amounts of each element vary within specified ranges. In an embodiment of the invention, the nanocomposite coating includes silicon in an amount ranging from about 5% to about 50% of the total number of atoms in the coating. In another embodiment of the invention, the nanocomposite coating includes silicon in an amount ranging from about 15% to about 35% of the total number of atoms in the coating. In one exemplary embodiment of the invention, the nanocomposite coating includes silicon in an amount of about 20% of the total number of atoms in the coating.

Carbon is also included in an embodiment of the nanocomposite coating in an amount ranging from about 5% to about 50% of the total number of atoms in the coating. In another embodiment, carbon is included in an amount ranging between about 10% and about 35% of the total number of atoms in the coating. In one exemplary embodiment, carbon is included in the nanocomposite coating in an amount of about 20% of the total number of atoms in the coating.

Oxygen is also included in an embodiment of the nanocomposite coating in an amount ranging from about 10% to about 80% of the total number of atoms in the coating. In another embodiment, oxygen is included in an amount ranging between about 30% and about 65% of the total number of atoms in the coating. In one exemplary embodiment, oxygen is included in the nanocomposite coating in an amount of about 55% of the total number of atoms in the coating.

Nitrogen is also included in an embodiment of the nanocomposite coating in an amount ranging from about 2% to about 20% of the total number of atoms in the coating. In another embodiment, nitrogen is included in an amount ranging between about 4% and about 6% of the total number of atoms in the coating. In one exemplary embodiment, nitrogen is included in the nanocomposite coating in an amount of about 5% of the total number of atoms in the coating.

In various embodiments of the nanocomposite coating, the relative amounts of elements in the coating correspond to a chemical composition $Si_xC_yO_zN$, where x may range from about 0.25 to about 25, y may range from about 0.25 to about 25, and z may range from about 1.5 to about 40. In another embodiment, x may range from about 2.5 to about 8.75, y may range from about 1.7 to about 8.75, and z may range from about 5 to about 16.25. In one exemplary embodiment, x may be about 4, y may be about 4, and z may be about 11.

In some embodiments, the nanocomposite coating may also include the element hydrogen in an amount of less than 1% of the total number of atoms in the coating. In other embodiments, the coating may include hydrogen in an amount of less than 0.5% of the total number of atoms. In yet another embodiment, the nanocomposite coating may include less than about 0.1% of the total number of atoms in the coating.

B. Physical Structure of Nanocomposite Coating Material

In an embodiment, the nanocomposite coating material consists of nanocrystals in an amorphous silicon oxide matrix. The nanocrystals are nearly as hard as diamond, and provide the nanocomposite with a high hardness, described below. The amorphous silicon oxide matrix of the nanocomposite coating material is generally flexible, allowing the coating to flex without cracking.

1. Nanostructures

The nanocomposite coating material of an embodiment of the present invention includes nanostructures ranging in size from about 10 nm to about 25 nm. The nanostructures are distributed evenly throughout the amorphous silicon oxide matrix component of the coating material. The nanostructures consist of compounds selected from the list comprising amorphous SiC, amorphous $SiO_2$, amorphous carbon, amorphous carbon nitride (CN), nanocrystalline SiC, nanocrystalline carbon, nanocrystalline carbon nitride (CN), and combinations thereof. The nanocrystalline phases within the nanostructures possess crystalline structures selected from the list comprising cubic, hexagonal, face centered cubic (FCC), body-centered cubic (BCC), simple tetragonal, body-centered tetragonal, rhombohedral, simple orthorhombic, base-centered orthorhombic, body-centered orthorhombic, face-centered orthorhombic, simple monoclinic, base-centered monoclinic, triclinic, and combinations thereof.

In an exemplary embodiment, the nanocrystals are composed of SiC. Nanocrystalline SiC shares many of the properties of single crystal SiC such as high hardness of the material. The nanostructures containing nanocrystalline SiC phase may also include carbon and CN either in amorphous phase or in crystalline phase, or combinations thereof.

2. Amorphous Silicon Oxide Matrix

The nanocomposite coating material of an embodiment of the present invention also includes an amorphous silicon oxide matrix, in which the nanocrystals are embedded. The amorphous silicon oxide matrix is relatively soft and flexible compared to the nanocrystals, enhancing the crack resistance of the nanocomposite coating. In addition, amorphous silicon oxide has a relatively high breakdown field.

The amorphous silicon oxide matrix may also contain nitrogen in an amount ranging from about 1% to about 20% of the total atoms in the coating. In another embodiment, the amorphous silicon oxide matrix may include nitrogen in an amount ranging between about 4% and about 6% of the total number of atoms in the coating. In one exemplary embodiment, the amorphous silicon oxide matrix may include nitrogen in an amount of about 5% of the total number of atoms in the coating.

In some embodiments, the amorphous silicon oxide matrix may also contain hydrogen in an amount of less than 1% of the total atoms of the composition. In other embodiments, hydrogen may be present in an amount of less than 0.5% of the total atoms of the composition. In one exemplary embodiment, the amorphous silicon oxide matrix may contain hydrogen in an amount of less than 0.1% of the total atoms of the composition.

The nitrogen content of the coating material is relatively insensitive to variations in the deposition conditions described in detail below. However, the hydrogen content of the material may be specified by variations in the deposition conditions, also discussed in detail below. Elevated hydrogen content in the nanocomposite coating material, even at trace levels that are less than 1% of the overall atomic content of the coating, may cause alterations to the material such as decreasing the coating hardness or lowering refractive index of the coating.

C. Mechanical Properties of Coating—Hardness, Roughness, and Flexibility

In various iterations of the invention, the nanocomposite coating material has a hardness ranging from about 4 GPa to about 14 GPa. In other embodiments of the invention, the hardness of the material may range from about 10 GPa to about 13 GPa. In one exemplary embodiment of the invention, the hardness of the nanocomposite coating material may be about 12 GPa. Without being bound to any particular theory, the hardness of the nanocomposite material is likely due to the presence of nanocrystals that are included in the nanocomposite coating material. The hardness of the nanocomposite coating is generally highest when deposited on a harder substrate such as crystalline silicon, metal, or glass. The hardness of the coating is typically decreased when the coating is deposited on a softer coating such as plastic. Further, the hardness of the coating may be decreased in proportion to the amount of hydrogen included in the nanocomposite coating. In addition, the hardness of the coating is increased at higher deposition temperatures.

The nanocomposite coating material has a surface roughness, expressed as the mean height of the surface projections, ranging from about 0.2 nm to about 2 nm in one embodiment. In another embodiment, the surface roughness ranges from about 0.5 nm to about 1.5 nm. In one exemplary embodiment, the surface roughness of the nanocomposite coating material is about 1.2 nm. The coating surface is generally rougher when the nanocomposite is deposited on a plastic substrate, compared to the coating deposited on silicon, glass, or metal substrates. In addition, thicker nanocomposite coatings are also generally rougher than thinner coatings.

The hardness of the nanocomposite coating make it suitable as a scratch-resistant surface coating for dental brackets, bearings, plastic parts, plumbing hardware such as faucets and shower heads, drill bits, milling machine heads, and milling machine cutters. The nanocomposite coating is also typically flexible, making it suitable for deposition on flexible substrates such as thin metals or thin plastics. The coating may be rolled into a tube and unrolled without any adverse effects on the coating such as delamination or cracking.

D. Electrical Properties of the Coating—Breakdown Field, Dielectric Constant, and Bandgap The electrical properties of the nanocomposite coating, combined with the mechanical properties, make the material suitable for a variety of small-scale electrical devices including high-energy density capacitors, MOSCAP devices, and as a thin film electrical insulator. In addition to the electrical properties intrinsic in the composition of the coating material, the electrical properties are further enhanced by the ability of the nanocomposite coating to be deposited to thicknesses as high as 50 µm or higher with minimal flaws such as cracks or delamination.

The nanocomposite coating material generally has a breakdown field ranging from about 3 MV/cm to about 8 MV/cm. In another embodiment, the breakdown field ranges from about 5 MV/cm to about 7 MV/cm. In one exemplary embodiment, the breakdown field of the nanocomposite coating material is about 6.5 MV/cm. Coatings of a thickness greater than 1 µm may have lower breakdown fields compared to the breakdown fields of thinner coatings. Further, nanocomposite coatings that are deposited on glass or quartz substrates generally exhibit higher breakdown fields compared to similar nanocomposite coatings deposited on plastic. The breakdown field may also be affected by variations in the deposition process, described in detail below.

The dielectric constant of the nanocomposite coating material may range from about 5 to about 6. In another embodiment the dielectric constant may range between about 5.3 and about 5.7. In one exemplary embodiment, the dielectric constant of the nanocomposite coating material is about 5.5. The dielectric constant may be additionally affected by variations in the deposition process, described in detail below.

The bandgap of the nanocomposite coating material falls within a range suitable for use as a semiconductor. The nanocomposite coating material generally has a bandgap ranging from about 3 eV to about 5 eV. In another embodiment, the bandgap may range between about 3.5 eV to about 4.5 eV. In one exemplary embodiment, the nanocomposite coating material has a bandgap of about 4 eV. The bandgap may be slightly reduced for thicker coatings, as well as for coatings that are deposited with higher deposition rates. The bandgap may also be affected by variations in the deposition process, described in detail below.

The electrical properties of the nanocomposite coating are also resistant to degradation by nuclear radiation, making the coating suitable as a dielectric layer in a nuclear battery.

E. Chemical Properties of the Coating—Water Contact Angle and Fluorescence

The chemical properties of the nanocomposite coating material make them further suited for a variety of additional applications. Using specified variations in the deposition process, described in detail below, the nanocomposite coating may be made hydrophilic or hydrophobic. The hydrophobic property of the nanocomposite coating makes the coating suitable for applications including surgical instruments, window glass, windshields, and laboratory glassware.

The nanocomposite coating material may be fabricated to a specified water contact angle ranging from about 5° to about 100°. Water contact angle, as defined herein, is the angle measured between the coating surface covered by a water droplet, and exterior surface of edge of the water droplet in the vicinity of the intersection of the droplet and the coating. Low water contact angles typically indicate a hydrophilic surface, while high water contact angles typically indicate a hydrophobic surface.

In certain embodiments, the nanostructured coating material fluoresces when excited by ultraviolet light, making the coating material further suited for photonic devices including light-emitting diodes. In various iterations of the invention, the coating material fluoresces at maximum intensity at a wavelength ranging from about 450 nm to about 600 nm. In other embodiments, the wavelengths range from about 500 nm to about 550 nm. In one exemplary embodiment, the coating material fluoresces at a wavelength of about 520 nm, corresponding to green light in the visible spectrum. The maximum intensity of the light fluoresced by the coating is typically enhanced in thicker nanostructured coatings. Further, the wavelength of maximum fluorescence intensity may be affected by variations in the deposition process, described in detail below.

F. Optical Properties of the Coating—Refractive Index

The refractive index of the nanocomposite coating material may range from about 1.4 to about 1.7. In other embodiments, the refractive index may range from about 1.5 and about 1.6. In one exemplary embodiment, the refractive index of the nanocomposite coating material is about 1.6. This range of refractive indices makes the nanocomposite coating material suitable as an antireflection coating for a variety of optical devices. The refractive index of the nanocomposite coating material may be specified within limits by controlled variations of the deposition process, described in detail below.

III. Process of Depositing SiCON Coating

An embodiment of the present invention further provides a process for depositing a nanocomposite coating material on the surface of a substrate. The process includes the steps of adding gaseous reactants to a deposition chamber containing at least one substrate, and then ionizing the gaseous reactants in the deposition chamber, causing the reactants to form a solid SiCON coating that deposits on the substrates in the deposition chamber. The solid coating resulting from the process is as described in Section II.

A. Methods of Coating Deposition

The deposition process of the present invention may be accomplished using any of a variety of chemical vapor deposition methods known in the art, including chemical vapor deposition (CVD), hot wire chemical vapor deposition, plasma enhanced chemical vapor deposition, and microwave plasma assisted chemical vapor deposition. In any general chemical vapor deposition method, as defined herein, a substrate is exposed to one or more volatile precursor reactants in a deposition chamber, which react or decompose on or near the substrate's surface, forming the desired coating. Any volatile, undesired reaction by-products are removed from the deposition chamber.

The vapor deposition processes discussed typically require some sort of energetic input in order to transform the precursor reactants into a volatile state. CVD is typically performed in the deposition chamber at elevated temperatures of about 1000° C. or more. Hot wire chemical vapor deposition uses the thermal energy of a heated wire to activate the precursor reactants, allowing the deposition to be performed at somewhat lower deposition chamber temperatures. Plasma enhanced chemical vapor deposition techniques use electrical fields or microwave energy applied to the deposition chamber to ionize the gaseous precursor reactants, transforming the reactants into a plasma state. Plasma enhanced vapor deposition techniques achieve the deposition of coatings at temperatures as low as room temperature.

In various embodiments of the present invention, the process of depositing a coating is PECVD. In PECVD, the substrate is initially placed between a pair of electrodes located in the deposition chamber. The temperature of the substrate in the deposition chamber is set to a desired temperature, typically about 400° C. or less. In addition, the pressure of the deposition chamber is set to a desired level, typically less than atmospheric pressure. Gaseous reactants are continuously replaced in the deposition chamber by gas lines connected to the chamber, and undesired reaction by-products are pulled out of the reaction chamber by an exhaust line connected to the deposition chamber. Once the continuous flow of gaseous reactants and the removal of excess reactants have been stabilized in the deposition chamber, the electric plates in the deposition chamber are supplied with electrical power in the form of RF power, or more typically in the form of high frequency AC power. The electrical power supplies the energy required to ionize the gaseous reactants in the deposition chamber, causing the gaseous reactants to react and form a coating that accumulates on the surface of the substrate.

B. Process Conditions

The PECVD method of coating deposition, as described in detail above, has several conditions that may be specified to ensure that a coating with desired mechanical, chemical, electrical, and optical properties may be obtained. The properties of the coating material may be specified, within the limits of the process, by variations in the PECVD process conditions. The conditions used for the coating deposition process of the current invention, as well as the effects of variations of the process conditions on the properties of the resulting coating material, are discussed in detail below.

1. Size of Deposition Chamber

In one exemplary process, SiCON coating is deposited on a substrate using a PECVD apparatus known in the art. The PECVD apparatus is constructed with a deposition chamber in which the substrate is placed prior to depositing the coating. It is envisioned, in various environments, that two or more substrates may be placed in the deposition chamber. Thus, the maximum dimensions of the substrate are limited to those dimensions that are capable of fitting in a PECVD apparatus. The inner dimensions of PECVD deposition chambers typically range from about 10 cm to about 100 cm. In addition, the plate electrodes inside of the deposition chamber are typically spaced at distance ranging from about 1 cm to about 4 cm. Therefore, for deposition chambers of the aforementioned size, the substrate size is limited to those substrates that are no more than about 100 cm long, about 100 cm wide, and that are no more than about 2 cm thick.

In order to coat a substrate with a three dimensional surface topography, the substrate may need to be repositioned during the coating process in order to coat surfaces that were not exposed to the coating in the deposition chamber. Therefore, in the case of three-dimensional substrates, the substrate size may be limited to those dimensions that will fit within the deposition chamber at each position required to coat the entire surface. Alternatively, the deposition chamber may contain arrays of electrodes that are oriented in such a way as to allow the deposition of the coating on an entire three-dimensional surface without need for repositioning during the coating deposition process.

2. Pressure of Deposition Chamber

During the SiCON coating process of an embodiment of the present invention, the deposition chamber is generally maintained at a pressure ranging from about 1 torr to about 10 torr. In other embodiments, the chamber pressure is maintained at a pressure ranging from about 5 torr to about 9 torr. In one exemplary embodiment, the deposition chamber for the deposition process is maintained at a pressure of about 7 torr. When a higher deposition chamber pressure is used during the deposition process of the present invention, typically a thicker and more uniform coating layer may be deposited on the substrate.

3. Temperature of Substrate in Deposition Chamber

The coating deposition process of the present invention uses a temperature inside of the deposition chamber ranging from about 20° C. to about 450° C. In one exemplary embodiment, deposition is performed at a deposition chamber temperature of about 100° C. The temperature of the substrate inside of the deposition chamber during the deposition process affects the choice of substrate material, since the substrate materials are limited to those materials that have melting points higher than the temperature inside the deposition chamber. Because most plastics have a melting point of about 200° C., the deposition chamber temperature of the present invention makes possible the deposition of the SiCON coating on plastic materials, and other materials with lower melting points.

The deposition chamber temperature used during the coating process also affects several properties of the coating, including coating thickness, the composition of the coating, and the bandgap of the coating. A higher deposition chamber temperature results in a thicker coating. The sensitivity of the coating's bandgap to variations in the deposition chamber fabrication temperature is dependent on the thickness of the coating. For example, when depositing coatings that are up to about 3 µm thick or more, higher deposition chamber temperatures may result in coatings with lower bandgaps. When depositing coatings that are thinner than about 100 nm, higher deposition temperatures may result in coatings with higher bandgaps.

4. Electrical Power in Deposition Chamber

Electrical power is supplied to the plate electrodes in the deposition chamber in order to provide the energy required to transform the gaseous reactants into volatile plasma. Electrical power may be supplied to the plate electrodes as either DC power, or high frequency AC power. DC power may be supplied to the electrodes at a potential ranging from about 10 V to about 100 V. If DC power is supplied to the electrodes, the energy is transferred to the gaseous reactants by electrical discharge between the electrodes. If AC power is supplied to the electrodes, the power may be supplied to the electrodes at a frequency ranging from about 100 kHz to about 15 MHz.

In one exemplary embodiment, AC power is supplied to the electrodes at a frequency of about 13.56 MHz. The power supplied to the deposition chamber may range from about 100 W to about 1400 W. In other embodiments, the power supplied may range between about 400 W and about 800 W. In one exemplary embodiment, the power supplied to the deposition chamber is about 400 W.

Generally speaking, increasing the amount of power supplied to the electrodes in the deposition chamber increases the thickness of the resulting coating.

5. Duration of Deposition Process

The duration of the deposition process of the present invention can and will vary. For example, the durations may range between about five seconds and about three hours. In one exemplary embodiment, the deposition time may be about thirty minutes. The duration of the deposition process of the present invention, in combination with the deposition rate, generally determines the thickness of the coating deposited on the substrate. In addition, the atomic composition of the SiCON may be altered slightly depending on the coating thickness. For example, a thinner coating of about 1 µm contains relatively more oxygen and silicon than a thicker coating of about 9 µm. The duration of coating deposition using PECVD methods may also depend on the operational limits of the PECVD apparatus used, including overheating limits and the available space for the growth of coating material on the substrate in the deposition chamber.

6. Gaseous Reactants

In various embodiments of the coating deposition process of the present invention using PECVD, gaseous reactants are introduced continuously into the deposition chamber to maintain the proportions of reactants required to deposit a SiCON coating on a substrate. The proportions of the reactants for various embodiments of the invention can and will vary, depending on the desired properties of the resulting SiCON coating. For example, in one embodiment, silane, methane, nitrous oxide, and hydrogen are introduced into the deposition chamber at a silane:methane:nitrous oxide:hydrogen molar ratio of about 1:20:13.3:120. In other embodiments, three gaseous reactants comprising diethylsilane ($SiC_4H_{12}$), nitrous oxide and hydrogen are introduced into the deposition chamber at a diethylsilane:nitrous oxide:hydrogen molar ratio of 1:7.5:90. In other embodiments, three gaseous reactants comprising tetramethylsilane ($Si(CH_4)_4$), nitrous oxide and hydrogen are introduced into the deposition chamber at a tetramethylsilane:nitrous oxide:hydrogen molar ratio of 1:7.5:90. Each of the gaseous reactants are discussed separately in detail below, including the effects of variations in the amount of each gaseous reactant supplied to the deposition chamber on the properties of the resulting coating.

a. Silane ($SiH_4$)

During the coating deposition of the present invention, silane is typically supplied to the deposition chamber as a source of silicon. Silane is continuously supplied to the deposition chamber at a flow rate that may range from about 5 sccm (standard $cm^3$/min) to about 75 sccm. In other embodiments, the flow rate of silane may range from about 10 sccm and about 40 sccm. In one exemplary embodiment, silane is continuously supplied to the deposition chamber at a flow rate of about 15 sccm.

The rate of silane supplied to the deposition chamber may impact several properties of the resulting SiCON coating. In general, increasing the rate of silane supplied to the deposition chamber increases the thickness of the coating, and increases the relative amount of silicon contained in the SiCON coating. In addition, increased silane supply in the deposition chamber may increase the bandgap of the coating, decrease the breakdown field, and reduce the hardness of the coating. Moreover, an enhanced supply of silane to the deposition chamber may result in a coating that is more hydrophobic.

b. Methane ($CH_4$)

Carbon is supplied to the deposition chamber through the continuous supply of methane gas to the deposition chamber. Methane is supplied to the deposition chamber at a flow rate that may range from about 100 sccm (standard $cm^3$/min) to about 750 sccm. In other embodiments, the methane flow rate may range from about 200 sccm to about 500 sccm. In one exemplary embodiment, methane is continuously supplied to the deposition chamber at a flow rate of about 300 sccm.

The rate of methane supplied to the deposition chamber may impact several properties of the resulting SiCON coating. Increasing the rate of methane to the deposition chamber may result in a coating with a higher proportion of carbon atoms. In addition, an increased supply of methane to the deposition chamber may result in a SiCON coating with a lower breakdown field, or a softer surface hardness overall. Also, increasing the rate of addition of methane may result in a coating that is more hydrophobic.

c. Nitrous Oxide ($N_2O$)

Nitrous oxide is supplied to the deposition chamber as a source of oxygen for the deposition reactions. Nitrous oxide is continuously supplied to the deposition chamber at a flow rate that may range from about 50 sccm (standard $cm^3$/min) to about 300 sccm. In other embodiments, the nitrous oxide flow rate may range from about 100 sccm and about 200 sccm. In one exemplary embodiment, nitrous oxide is supplied to the deposition chamber at a flow rate of about 150 sccm.

An enhanced supply of nitrous oxide to the deposition chamber typically results in a coating with higher oxygen content, lower silicon content, and lower carbon content. Without being bound to any particular theory, the oxygen supplied to the deposition chamber in the nitrous oxide may interfere with the incorporation of hydrogen into the SiCON coating, and may result in a coating that is essentially free of hydrogen, with enhanced hardness. An increased rate of nitrous oxide supplied to the deposition chamber may also increase the bandgap or decrease the dielectric constant of the resulting coating. Increased nitrous oxide supply during deposition may also decrease the refractive index of the resulting coating, decrease the wave number of light fluoresced by the coating when excited by UV light, decrease the intensity of fluoresced light, and combinations thereof. Also, increasing the rate of nitrous oxide supplied to the deposition chamber may result in a coating that is more hydrophilic.

d. Hydrogen ($H_2$)

Hydrogen gas is supplied to the deposition chamber as a means of converting the electrical power supplied to the electrodes of the deposition chamber into ionization energy. Nearly all of the hydrogen supplied to the deposition chamber is excluded from the coating that is formed by the oxygen included in the coating. Hydrogen is continuously supplied to the deposition chamber at a flow rate that may range between about 300 sccm (standard $cm^3$/min) and about 3000 sccm. In other embodiments the hydrogen flow rate may range between about 1000 sccm and about 2000 sccm. In an exemplary embodiment, hydrogen is supplied to the deposition chamber at a flow rate of about 1800 sccm.

e. Diethylsilane ($C_4H_{12}Si$)

During the coating deposition of the present invention, diethylsilane is typically supplied to the deposition chamber as a source of silicon. Diethylsilane is continuously supplied to the deposition chamber at a flow rate that may range from about 5 sccm (standard $cm^3$/min) to about 75 sccm. In other embodiments, the flow rate of diethylsilane may range from about 10 sccm to about 40 sccm. In one exemplary embodiment, diethylsilane is continuously supplied to the deposition chamber at a flow rate of about 20 sccm.

The rate of diethylsilane supplied to the deposition chamber may impact several properties of the resulting SiCON coating. In general, increasing the rate of diethylsilane supplied to the deposition chamber increases the thickness of the coating, and increases the relative amount of silicon contained in the SiCON coating. In addition, increased diethylsilane supply in the deposition chamber may increase the bandgap of the coating, decrease the breakdown field, and reduce the hardness of the coating. Moreover, an enhanced supply of diethylsilane to the deposition chamber may result in a coating that is hydrophobic.

f. Tetramethylsilane ($Si(CH_3)_4$)

During the coating deposition of the present invention, tetramethylsilane is typically supplied to the deposition chamber as a source of silicon. Tetramethylsilane is continuously supplied to the deposition chamber at a flow rate that may range from about 5 sccm (standard $cm^3$/min) to about 75 sccm. In other embodiments, the flow rate of tetramethylsilane may range from about 10 sccm and about 40 sccm. In one exemplary embodiment, tetramethylsilane is continuously supplied to the deposition chamber at a flow rate of about 20 sccm.

The rate of tetramethylsilane supplied to the deposition chamber may impact several properties of the resulting SiCON coating. In general, increasing the rate of tetramethylsilane supplied to the deposition chamber increases the thickness of the coating, and increases the relative amount of silicon contained in the SiCON coating. In addition, increased tetramethylsilane supply in the deposition chamber may increase the bandgap of the coating, decrease the breakdown field, and reduce the hardness of the coating. Moreover, an enhanced supply of tetramethylsilane to the deposition chamber may result in a coating that is more hydrophobic.

As various changes could be made in the above compounds, products and methods without departing from the scope of the invention, it is intended that all matter contained in the above description and in the examples given below, shall be interpreted as illustrative and not in a limiting sense.

Definitions

To facilitate understanding of the invention, a number of terms and abbreviations as used herein are defined below.

The term "bandgap" generally refers to the energy difference between the top of the valence band and the bottom of the conduction band in a material used as an insulator, or in semiconductors.

The term "breakdown field" denotes the minimum voltage that causes a portion of an insulator to become electrically conductive, normalized to the thickness of the insulator.

The term "plasma" denotes compounds that are in a gaseous and ionized state, rendering the compounds more reactive.

The term "substrate" denotes a planar or porous surface, as the terms are used in any embodiment described herein.

EXAMPLES

The following examples illustrate several iterations of the invention.

Example 1

The Effect of Substrate Temperature During Deposition on the Structure and Composition of SiCON Coatings was Determined Using Fourier Transform Infrared (FTIR) Spectral Analysis To determine the effect of the temperature at which the substrate was maintained during the deposition of a SiCON coating using plasma enhanced chemical vapor deposition (PECVD), the following study was conducted. In this study, a dielectric material containing Si, C, O, and N, (SiCON) in a nanocomposite structure was prepared at three different temperatures, and the compositions of the coating were compared.

Prior to the deposition of the coating, boron doped p-type silicon (p-Si) substrates were cleaned using modified shiraki cleaning. The coatings were then deposited using PECVD at substrate temperatures of 100° C., 200° C., and 300° C. During PECVD, four reactant gases were introduced into the deposition chamber, which was maintained at a chamber pressure of 7 torr. Silane ($SiH_4$) was introduced to the deposition chamber at a flow rate of 15 sccm (standard $cm^3$/minute), methane ($CH_4$) was introduced at a flow rate of 300 sccm, nitrous oxide ($N_2O$) was introduced at a flow rate of 150 sccm, and hydrogen ($H_2$) was introduced at a flow rate of 1800 sccm. The plasma was created with 400 W of RF power. The thickness of the deposited layer was about 3 μm.

Fourier transform infrared (FTIR) spectrum was obtained for the samples deposited at the three different temperatures. FIG. 1 shows the spectrum for all three samples. FTIR spectrum shows a Si—O peak at a wave number of around 1100 $cm^{-1}$. The spectrum also indicated the presence of a Si—C peak around 800 $cm^{-1}$ and a C—N peak around 2200 $cm^{-1}$. The FTIR spectra indicated that the Si—H and C—H bonds were minimal in the all coatings.

The results of this study determined that there was minimal hydrogen present in the SiCON composite coatings deposited using the PECVD methods described above, and that substrate deposition temperature had little effect on the composition of the coating.

Example 2

The Nanocrystalline Structure of the SiCON Coating was Characterized Using Electron Microscopy Analysis To characterize the molecular structure of the SiCON coating, the following study was conducted. To visualize the molecular surface structure of the coating, samples were subjected to scanning electron microscopy (SEM). Internal features of the coating materials were further visualized by subjecting the sample to high-resolution transmission electron microscopy (HRTEM). The chemical structures contained within the coating were further measured using X-ray photoelectron spectroscopy (XPS).

Figure 2:
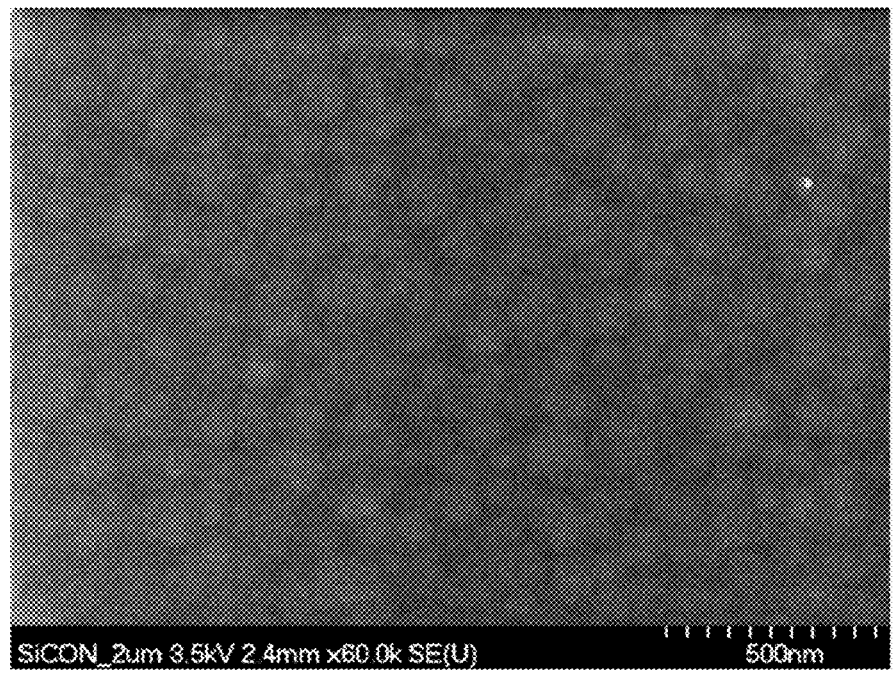
FIG. 2 depicts a scanning electron microscopy (SEM) image of the SiCON coating.
Figure 3:
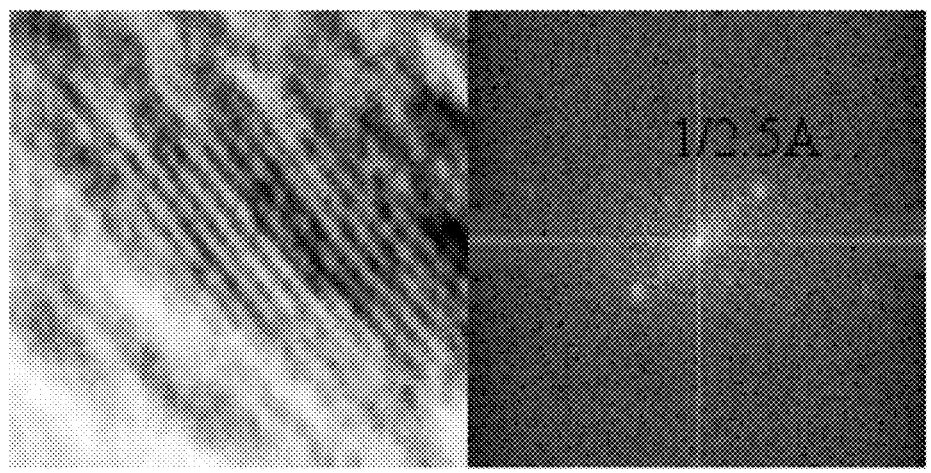
FIG. 3 depicts a high-resolution transmission electron microscopy (HRTEM) image with lattice fringes and the corresponding FTT pattern of the SiCON coating.

FIG. 2 shows a SEM image of the coating sample. The SEM image revealed surface features ranging in size from 50 to 100 nm which indicated that the coating was a nanocomposite material. A HRTEM image of the coating along with the corresponding FFT pattern is shown in FIG. 3. The HRTEM image shown in FIG. 3 revealed that the SICON coating material contained nanocrystals, which was supported by the observation of lattice fringes that were consistent with a crystalline structure. Calculations of the lattice spacing revealed that the crystals were SiC. Additional lattice fringes observed in the FFT patterns corresponding to the other HRTEM images of the coating suggested that other types of crystals were also present which may be carbon and carbon nitride.

Figure 4:
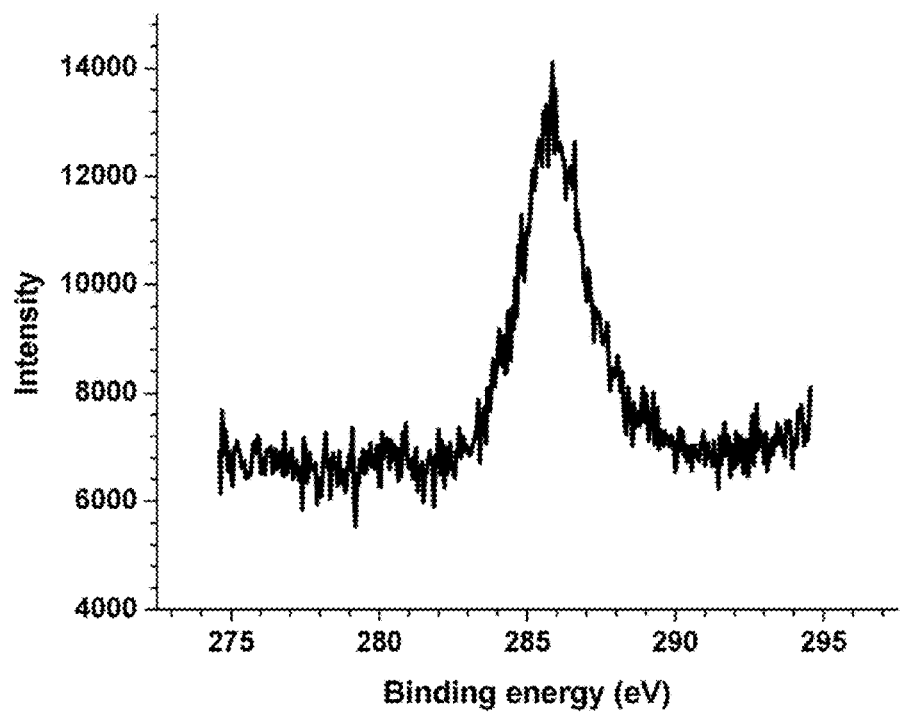
FIG. 4 depicts the XPS spectrum of a 2 μm thick SiCON coating sample.

To further verify the content of the nanocrystalline structures, a sample of the nanocrystals from the SiCON coating was subjected to X-ray photoelectron spectroscopy (XPS). FIG. 4 shows the measured intensities from the XPS analysis as a function of the binding energy. The XPS analysis determined that the nanocrystalline material had a broad spectrum (283 eV to 290 eV), which encompassed the peak positions corresponding to Si—C (284 eV), C—C (285.75 eV) and C—N (287 eV).

The results of this study indicated that the SiCON coating material is a nanocomposite material that may contain carbon and carbon nitride nanocrystals along with SiC nanocrystals.

Example 3

The Effect of Substrate Temperature During Deposition on the Bandgap of SiCON Coatings was Determined Using UV-Visible Spectroscopy Spectral Analysis To determine the effect of substrate temperature during the deposition of a SiCON coating using PECVD on the bandgap of the resulting coating, the following experiment was conducted. SiCON coatings were deposited on p-Si at thicknesses of three microns and 100 nm using PECVD at conditions similar to those described in Example 1. In a similar manner to Example 1, the coatings were deposited at substrate temperatures of 100° C., 200° C., and 300° C.

Figure 5A:
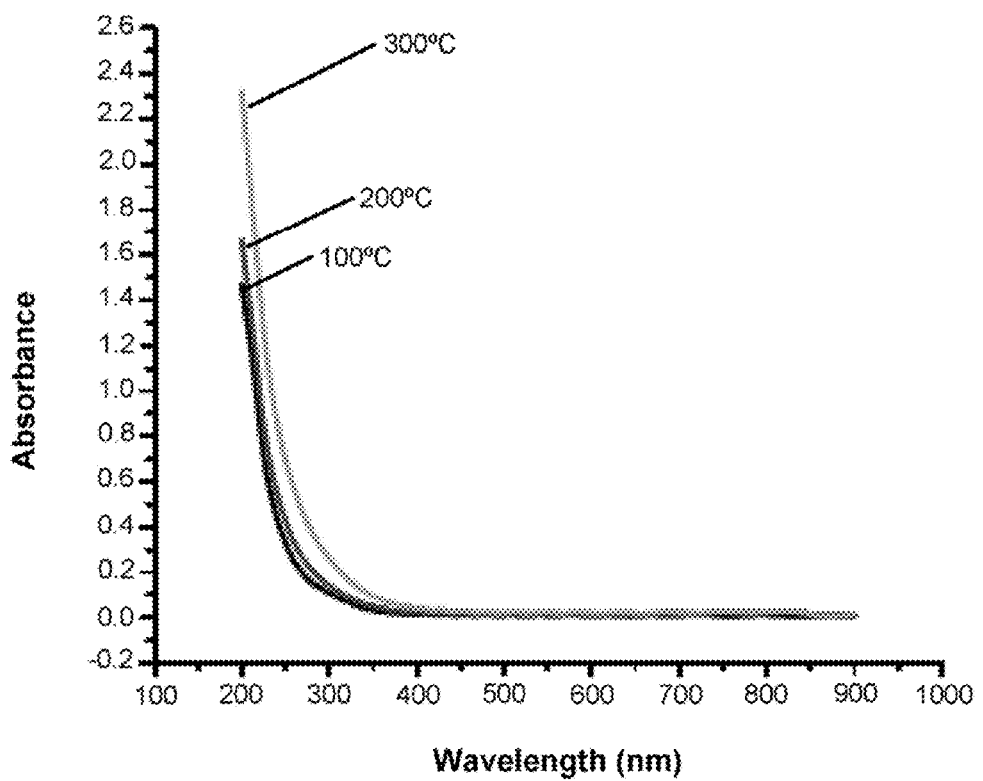
FIG. 5A depicts the absorbance spectra of the 3-micron thick SiCON coatings deposited at three different temperatures as a function of wavelength.
Figure 5B:
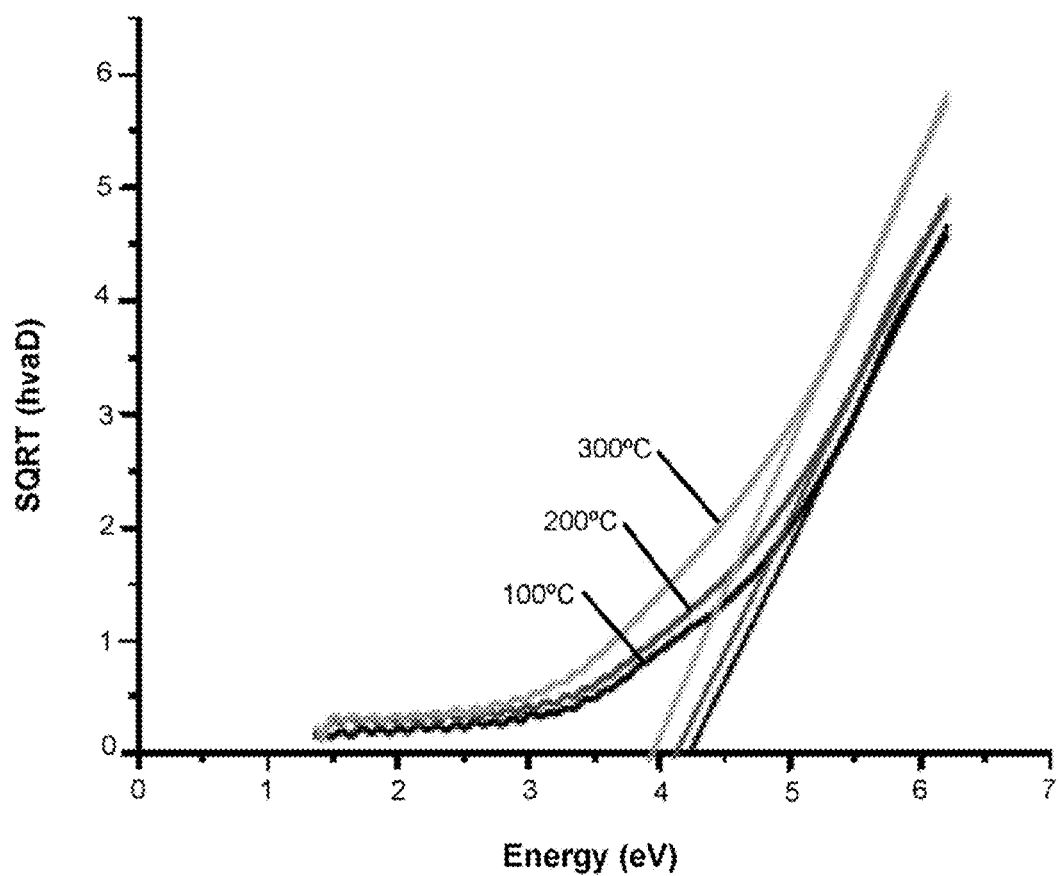
FIG. 5B depicts the bandgap calculation of the 3-micron thick SiCON coatings deposited at three different temperatures.
Figure 6:
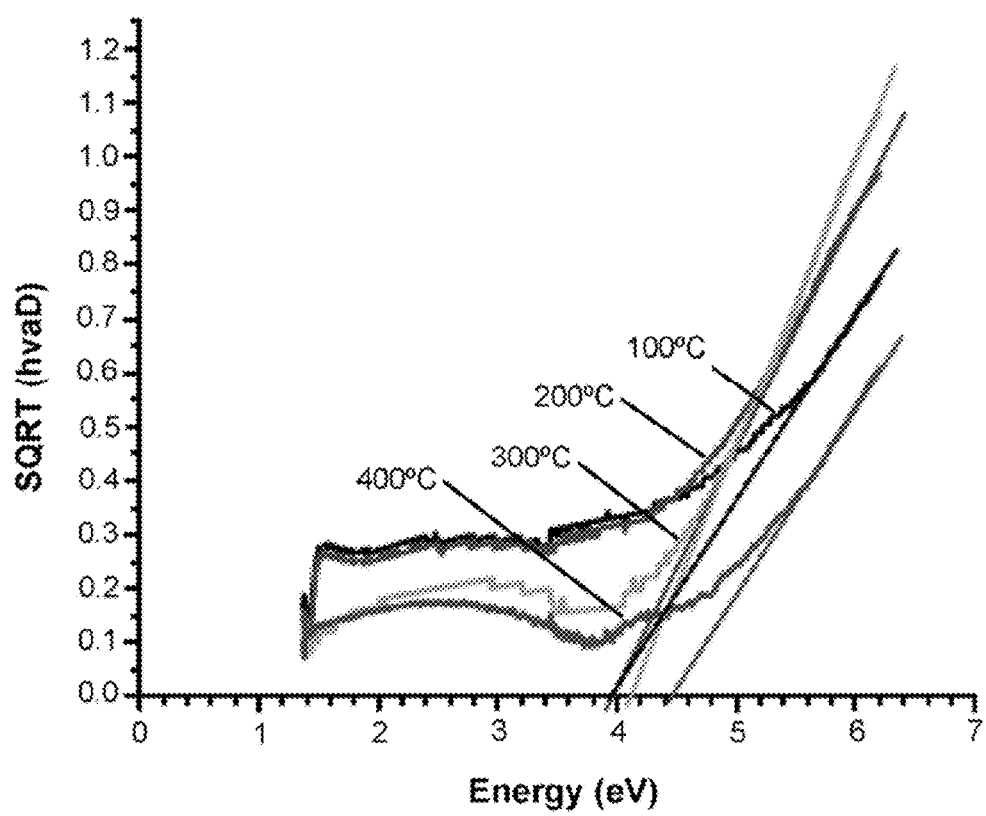
FIG. 6 depicts the bandgap calculation of the 100 nm thick SiCON coatings deposited at three different temperatures.

UV-Vis spectroscopy was used to calculate the bandgaps of the coatings. FIG. 5A shows the absorbance curves and FIG. 5B shows the SQRT(hvad), where hv is the energy of the incident light, a is the absorbance coefficient of the material and d is the thickness of the coating material. SQRT(hvad) is shown as a function of light energy for the 3-micron thick samples deposited at three different substrate temperatures. FIG. 6 shows the SQRT(hvad) vs. energy curves for the 100 nm-thick coatings prepared at four different substrate temperatures up to 400° C. The band gaps of the coatings were calculated from the SQRT(hvad) vs energy curves, and the band gaps for all coatings and temperatures tested are summarized in Table 1.

TABLE 1

Effect of Substrate Temperature during PECVD on Bandgaps of SiCON Coatings

| Substrate Temperature | Bandgap (eV) at Coating Thickness | |
|---|---|---|
| (° C.) | 3 μm | 100 nm |
| 100 | 4.2 | 3.9 |
| 200 | 4.1 | 3.9 |
| 300 | 3.9 | 4.1 |
| 400 |  | 4.4 |

The bandgaps of the thicker 3-micron coatings decrease at higher substrate deposition temperatures. However, for the thinner 100 nm coatings, the bandgaps increase as deposition temperature increases. The SQRT(hvad) vs energy curves shown in FIG. 6 indicated a local decrease in SQRT(hvad) at an energy of about 4 eV due to the quantum confinement of the SiCON nanocomposite coatings. All coatings tested also exhibited enhanced absorption at about 2.5 eV. It is believed that combination of nanoparticles and amorphous defects in the coatings are responsible for creating strong luminescence.

The results of this study demonstrated that the bandgaps of the SiCON coatings tested were relatively insensitive to the substrate deposition temperature. In addition, the tendency of bandgap to increase or decrease with respect to changes in substrate deposition temperature was shown to be dependent on the thickness of the coating.

Example 4

The Dielectric Properties of a SiCON Coating was Determined

To determine the dielectric properties of the SiCON coating, the following study was conducted. SiCON coating was deposited on a Ti-coated glass substrate in a MIM (Metal-Insulator-metal) structure, using the PECVD methods described in Example 1. The top contact was prepared using a shadow mask and depositing Ti by e-beam deposition. The thickness of the deposited SiCON coating used in this study was 4.6 microns. Voltages were applied to the MIM structure, and the resulting current was measured. The applied voltage was varied up to a maximum limit of 1500 V, due to system limitations.

Figure 7:
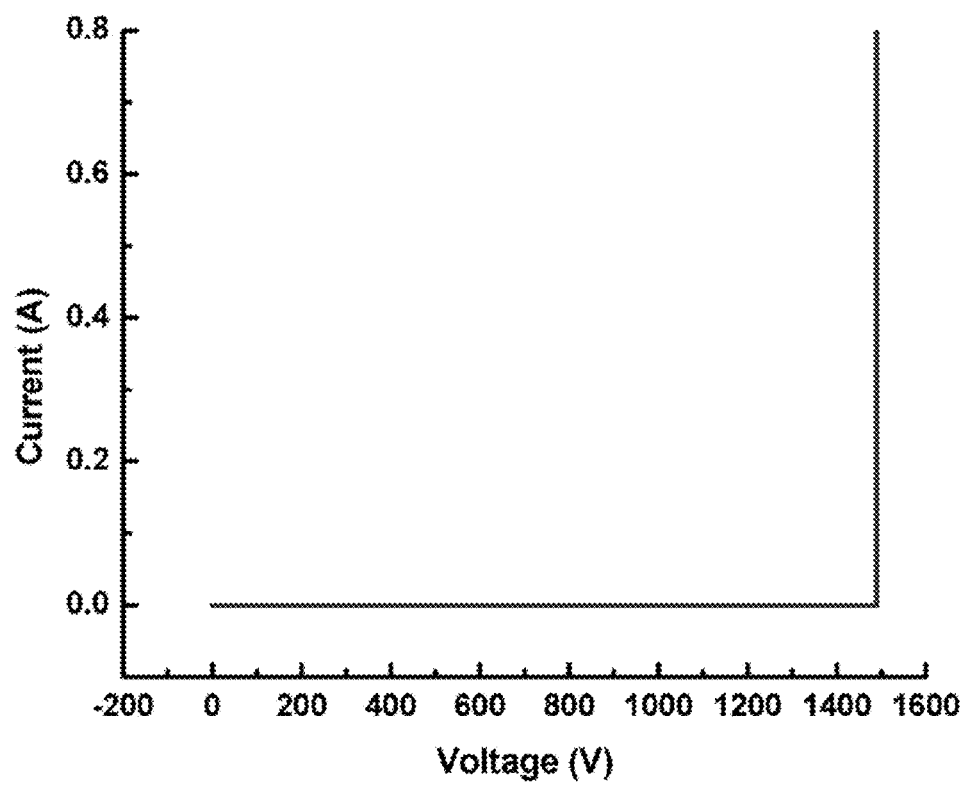
FIG. 7 depicts a current-voltage (IV) curve measured from a 4.6 μm thick SiCON coating, showing dielectric breakdown at an applied voltage of 1492 V.
Figure 8:
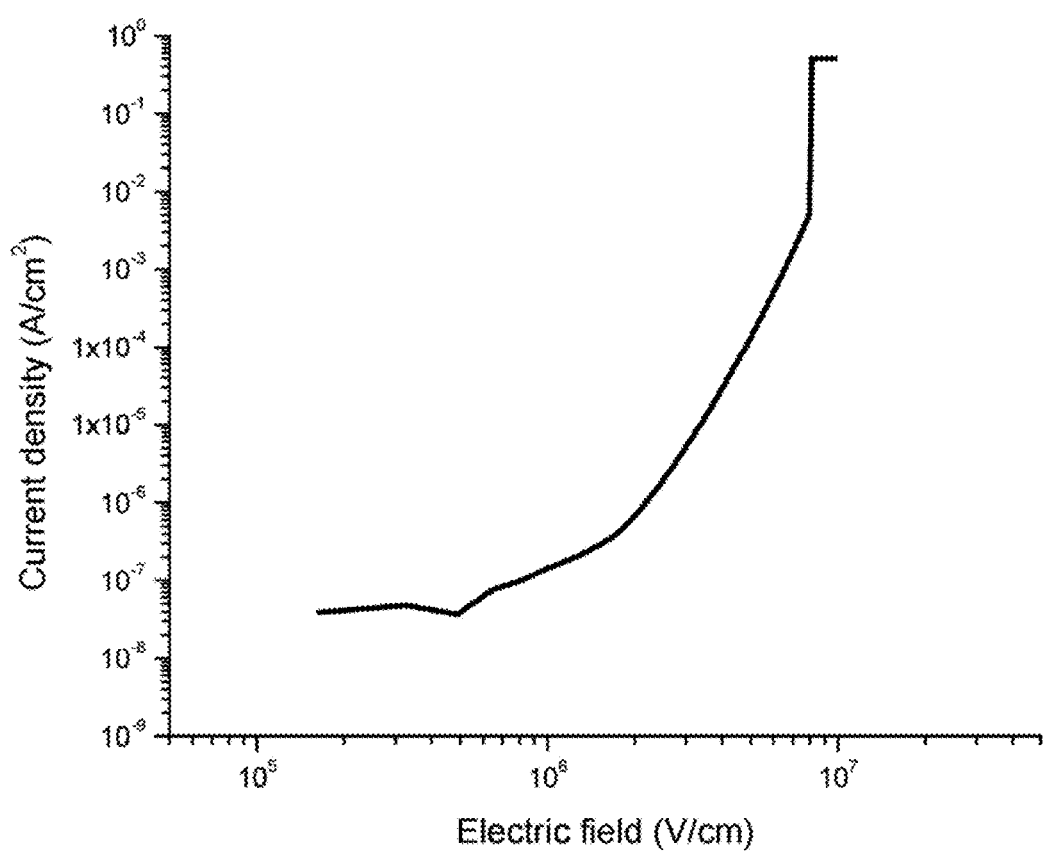
FIG. 8 depicts the current density as a function of electric field measured from a 100 nm thick SiCON coating.

FIG. 7 shows the measured current as a function of the voltage applied to the MIM structure described above. From the graph in FIG. 7, the breakdown voltage was determined to be 1492 V. FIG. 8 shows the measured current density as a function of the applied electric field for the 100 nm thick coating, shown on log-log axes. The graph in FIG. 8 showed very little leakage current before dielectric breakdown occurs.

One of the most important properties of a dielectric material is its breakdown field. The reported maximum dielectric field of amorphous silicon carbide (a-SiC) coating prepared by PECVD was 3.1 MV/cm for coatings with a thickness range from 90 nm to 1400 nm. The dielectric field measured in this study was 6.5 MV/cm for the thinner samples and 3.25 MV/cm for the thicker samples, which exceed the maximum reported dielectric field for an a-SiC coating.

The results of this study determined that the SiCON nanocomposite coatings possessed dielectric properties that were comparable or better than previously measured dielectric properties for a-SiC coatings.

Example 5

The Sensitivity of Breakdown Voltages to Changes in SiCON Coating Thickness was Determined for Coatings on Two Different Substrates Although breakdown voltage is an important factor used to characterize the dielectric properties of a coating material, breakdown voltage is typically a linear function of the coating thickness. The breakdown field, a measure of the sensitivity of the breakdown voltage to the thickness of the dielectric material, is another useful measurement. To determine the breakdown field for the SiCON coatings deposited on two different substrates, the following study was conducted.

SiCON coatings were deposited using the PECVD methods described in Example 1. The coatings were deposited on a Ti-coated glass substrate in a manner similar to that described in Example 4. SiCON coatings were also deposited on a Ti-coated plastic substrate at a substrate temperature of 100° C. SiCON coatings were deposited to thicknesses ranging between 0.5 microns to 7 microns. MIM structures were fabricated on the coated substrates using the methods described in Example 4, and voltages were applied up to a maximum of 1500 V to determine the breakdown voltage for each coating thickness.

Figure 9:
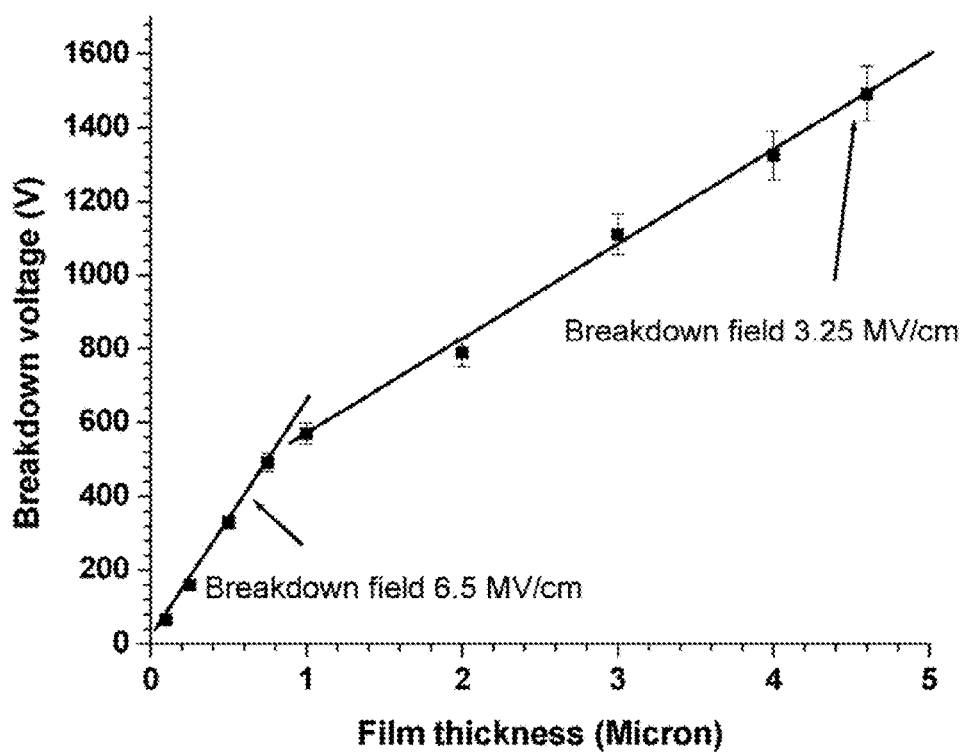
FIG. 9 depicts the breakdown voltage as a function of coating thickness for SiCON coatings up to 4.6 microns thick.
Figure 10:
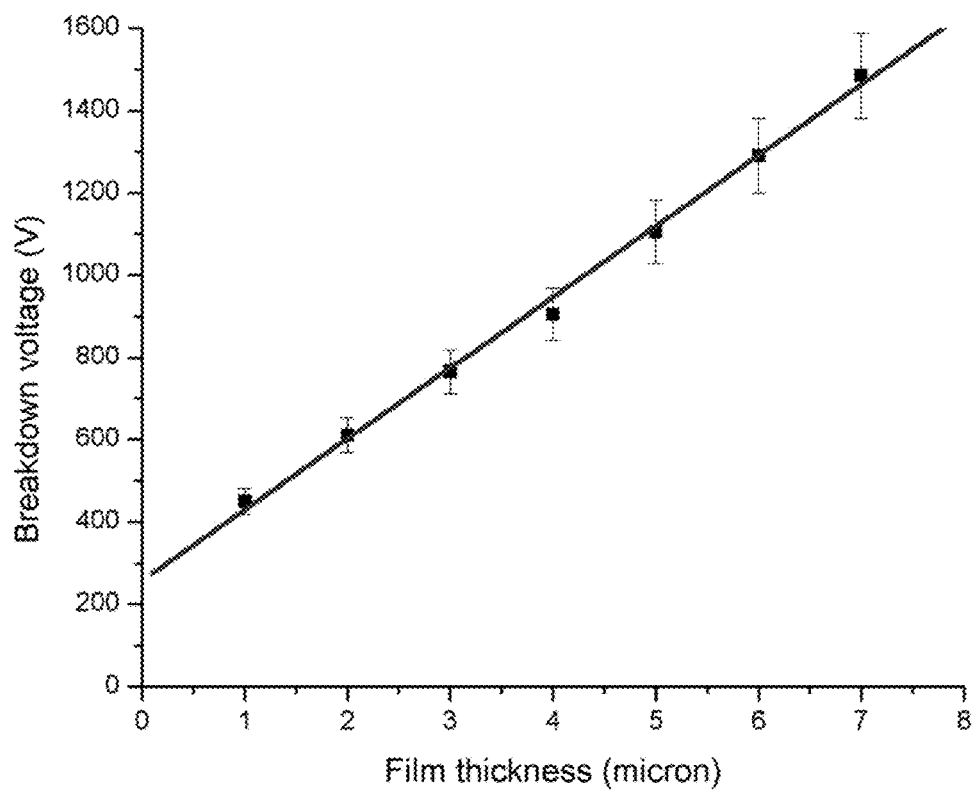
FIG. 10 depicts the breakdown voltage as a function of coating thickness for SiCON coatings up to 7 microns thick when the samples were prepared on plastic substrates.

FIG. 9 shows the breakdown voltage as a function of coating thickness for the coating on the glass substrate. From the figure it is clear that the breakdown voltage is not continuously linear with a single slope for the entire range of coating thickness. For coating thicknesses below 1 micron, the breakdown field is 6.5 MV/cm. At coating thicknesses of 1 micron and thicker, the breakdown field is 3.25 MV/cm. FIG. 10 shows the breakdown voltage of the SiCON coating deposited on a plastic substrate as a function of coating thickness. The breakdown field of SiCON on plastic is continuously linear throughout the entire range of thicknesses tested, with a breakdown field value of about 1.7 MV/cm.

The results of this study demonstrated desirable dielectric properties for the SiCON nanocomposite coatings. The breakdown voltages that were measured for SiCON coatings on plastic substrates was somewhat less than those measured for SiCON coatings prepared on glass or quartz substrates. The difference in surface energy of the substrate may play an important role in the nucleation and growth of the SiCON nanocomposite coatings on different substrates.

Example 6

The Dielectric Properties for the SiCON Coatings Were Determined as a Function of Applied Voltage Frequency To determine the effect of applied voltage frequency on the dielectric properties of the SiCON coating, the following study was conducted. A coating with a thickness of 100 nm was deposited on a Ti-coated glass substrate at room temperature using the methods described in Example 1. A MIM structure was fabricated using the coated substrate, using the methods described in Example 4. An oscillating voltage was applied to the MIM structure with oscillation frequencies of up to 1000 kHz, and the resulting capacitance was measured. Dielectric constants of the SiCON nanocomposite coating was calculated as a function of applied voltage frequency.

Figure 11:
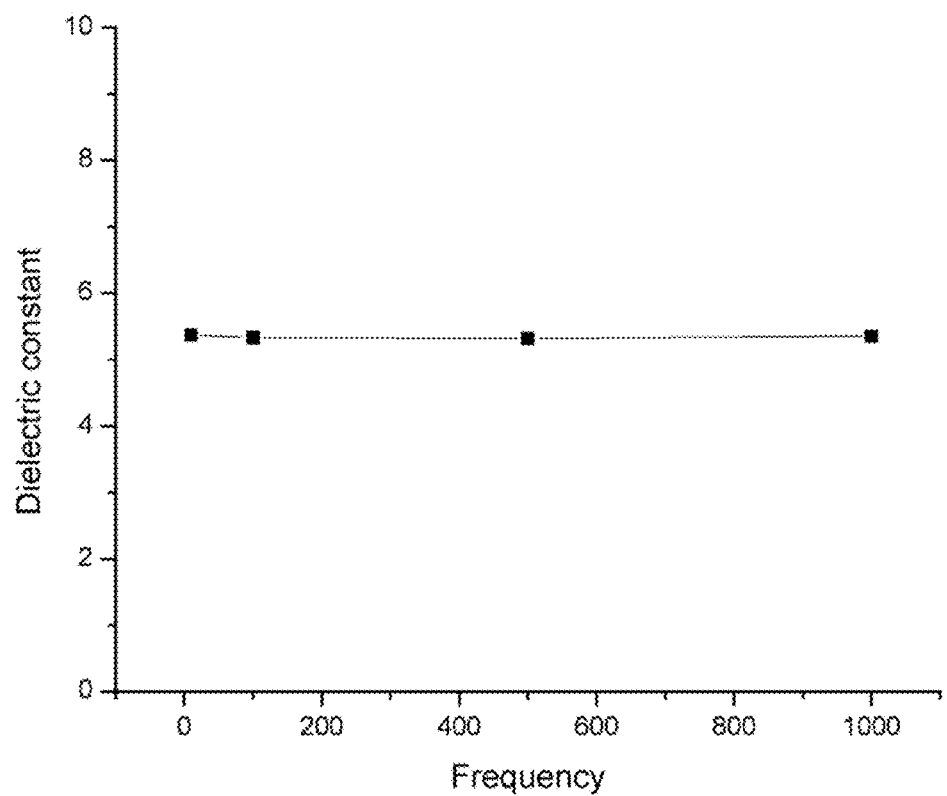
FIG. 11 depicts the dielectric constant as a function of frequency for a 100 nm SiCON coating deposited at room temperature.

FIG. 11 shows the calculated dielectric constant plotted as a function of applied voltage frequency. The dielectric constant of the coating material was constant with respect to frequency. FIG. 11 also confirms that dielectric constant value was over 5 for the SiCON coating for all applied voltage frequencies.

Figure 12:
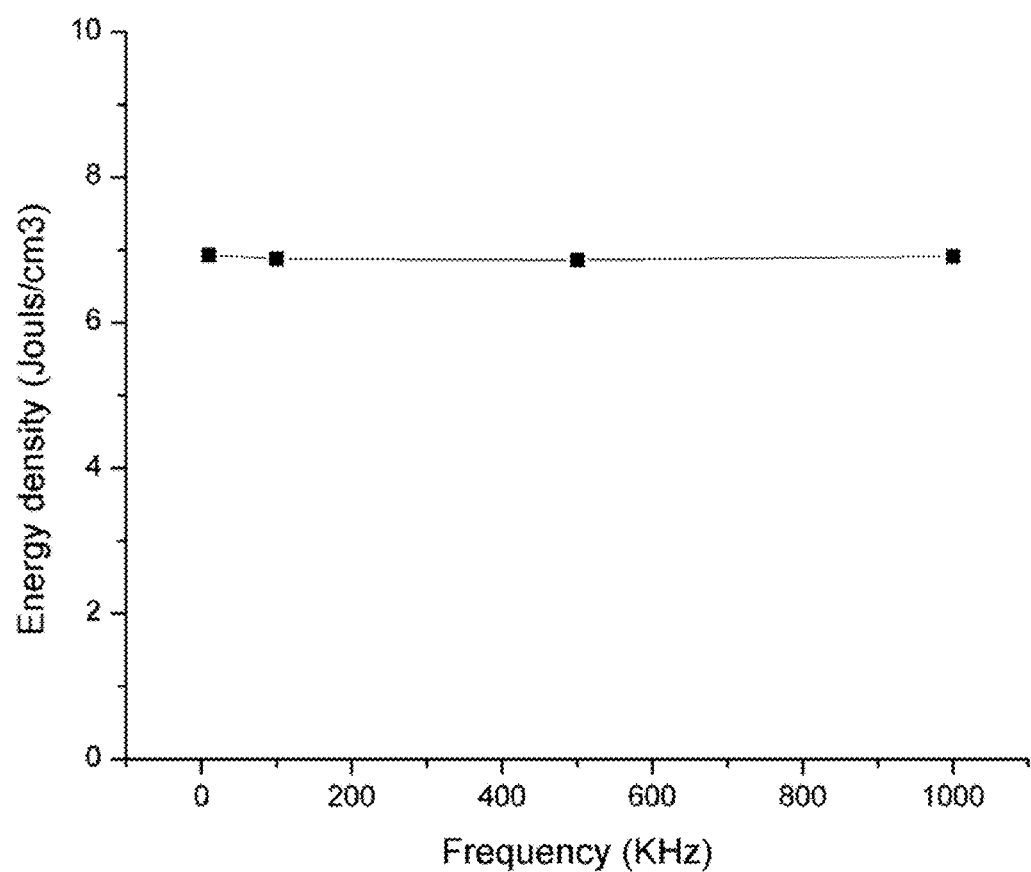
FIG. 12 depicts energy density as a function of frequency for a 100 nm SiCON coating deposited at room temperature.

FIG. 12 shows the energy density measured using a MIM structure fabricated using a 100 nm SiCON coating on Ti-coated glass as a function of applied voltage frequency. The energy density value was independent of the applied voltage frequency, and was measured at over 6 Jouls/cm$^3$. Similar measurements taken using a MIM structure with a 4.6 micron SiCON coating was 2.73 J/cm$^3$ The results of this study demonstrated that dielectric constants of over 5 were achieved by the nanocomposite SiCON coating, and energy densities ranged between about 2 J/cm$^3$ and about 6 J/cm$^3$, depending on coating thickness and substrate. These measured dielectric properties were independent of the applied voltage frequency. The SiCON coating has the potential for achieving even higher energy density since the thickness of the coating may be deposited as thick as 26 micron or more. Because the SiCON coating may be deposited on plastic substrates at temperatures of 100° C. or below, the fabrication cost may be reduced. Because the energy density of the SiCON is high, the capacitor size may be reduced to a smaller size than current state of the art high energy density capacitors.

Example 7

SiCON Coatings Were Deposited at Thicknesses Up to 26 μm Without Cracking

To determine the range of usable SiCON coating thicknesses that could be deposited using PECVD, the following experiment was conducted. SiCON coatings were deposited using the PECVD methods described in Example 1. SiCON coatings were deposited on a p-Si, glass, plastic, and metal substrates at thicknesses of up to 26 μm. After deposition, the coatings were inspected and determined to be free of cracks and delamination.

Figure 13:
FIG. 13 depicts the SiCON coating deposited at a thickness of 5 μm on a thin stainless steel substrate, in which the steel substrate has been rolled into a tube to determine the flexibility of the SiCON coating material.

To demonstrate the flexibility of the coating, SiCON was deposited on a stainless steel substrate to a coating thickness of 5 μm using PECVD as described in Example 1. The coating and substrate were then rolled up in to a tube as shown in FIG. 13, and then unrolled to its original flat shape. Subsequent inspection determined that the coating did not crack when it was rolled back to its original position.

The results of this study demonstrated that thick SiCON coatings of up to 26 μm could be achieved without delamination or cracking of the coating. Further, at least up to coating thicknesses of 26 μm, the SiCON coating could be flexed significantly without cracking. The thickness of coating achievable by the SiCON coating make possible very high energy density capacitors at a smaller size, due to the SiCON material's high dielectric constant and ability to be deposited in a thick layer. In addition, rollable capacitors may also be fabricated on thin plastic substrates due to the low substrate temperature necessary for the deposition of SiCON, and the flexibility of the coating up to thicknesses of at least 26

Example 8

A MOSCAP Device Was Constructed Using the SiCON Coating as the Active Dielectric To demonstrate the feasibility of constructing a MOSCAP (metal-oxide-semiconductor capacitor) device using the SiCON coating material as the active dielectric, the following study was conducted. A 5 nm thin layer of $Al_2O_3$ was deposited on a p-Si substrate using E-beam deposition to protect the interface between the Si substrate and the dielectric since plasma usually created defect states at the interface. A 50 nm thick SiCON coating was deposited on top of the $Al_2O_3$ layer at a substrate temperature of 200° C. An electrical connection was then deposited on top of the SiCON layer using the methods described in Example 4. The bias voltage was varied in a forward and reverse bias at a frequency of 1000 kHz and the resulting capacitance was measured.

Figure 14:
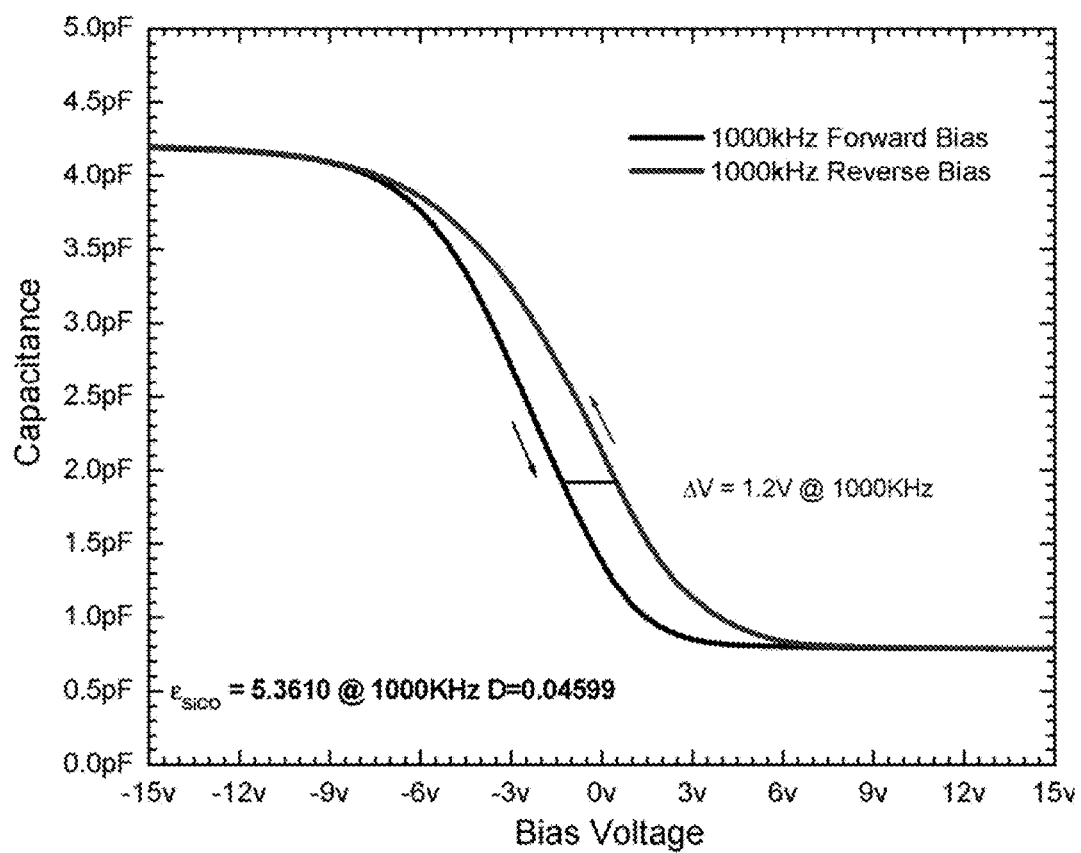
FIG. 14 depicts the capacitance as a function of the bias voltage of a metal-oxide-semiconductor capacitor (MOS-CAP) device fabricated using the SiCON coating showing the 1.2 V memory effect of the SiCON coating material.

FIG. 14 shows the C-V curve of the MOSCAP device. The device clearly showed the charge storage and memory effect by showing a hysteresis of 1.2 V between the forward and reverse bias curves.

The results of the study demonstrated that the SiCON coating, when used as the active dielectric material in a MOSCAP device, exhibited charge storage and a memory effect. The nanocrystals of the SiCON nanocomposite material functioned as charge storage sites. The dielectric properties of the SiCON material make it suitable for use in MOS capacitor or transistor devices.

Example 9

The Effect of Coating Thickness on the Fluorescence of SiCON was Determined

SiCON coatings fluoresce when excited by a UV light. To determine the effect of coating thickness on the fluorescence of SiCON coatings, the following study was conducted. SiCON coatings were deposited on p-Si substrate using PECVD methods described in Example 1. The coatings were deposited at thicknesses of 3 µm, 6 µm, 8.6 µm, and 11.6 µm. Each sample was excited by a UV light, and the intensity of the light that was fluoresced by the coatings was measured by a photometer for wavelengths ranging between 400 nm and 1000 nm.

Figure 15:
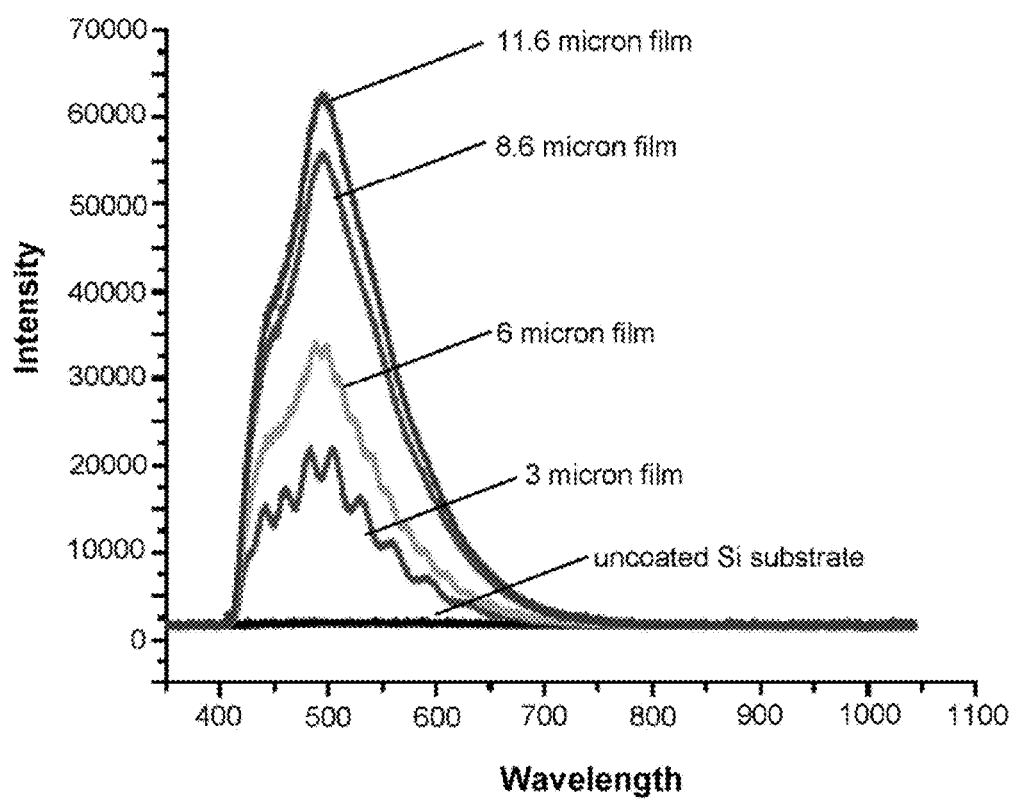
FIG. 15 depicts the fluorescent spectrum of the SiCON coatings of different thicknesses prepared at 100° C. on Si substrates.

FIG. 15 shows the fluorescent spectrum measured for each of the coating thicknesses. The fluorescent spectrum for a Si substrate with no SiCON coating is also shown for comparison. The spectra for the coatings exhibited peak intensities at a wavelength around 520 nm, which corresponded to green fluorescent light. The intensity of the light increased for thicker coatings throughout the fluorescence spectra.

The results of the study illustrated the ability of the SiCON coating to fluoresce green light when excited by a UV light source. The intensity of the fluoresced light depended directly on the thickness of the coating. The incident ultraviolet light created electron-hole pairs with high efficiency, and the resulting recombination occurred at the emission wavelength in the visible range. This light-emitting property of the SiCON coating enables the coating to be used in photonic devices such as light emitting diodes.

Example 10

The Effect of the Rate of Nitrous Oxide Supplied During the Deposition of SiCON Coating on the Fluorescent Spectrum of the Coating was Determined To determine the effect of the rate of nitrous oxide supply during the PECVD deposition of SiCON coating on the fluorescent spectra of the coatings, the following study was conducted. SiCON coatings were deposited on p-Si substrate using the PECVD methods described in Example 1. $N_2O$ flow rate was varied to control different properties of the material. The different flow rates of $N_2O$ that were used in this experiment were 200 sccm, 100 sccm, and 60 sccm while other deposition parameters were kept constant.

Figure 16:
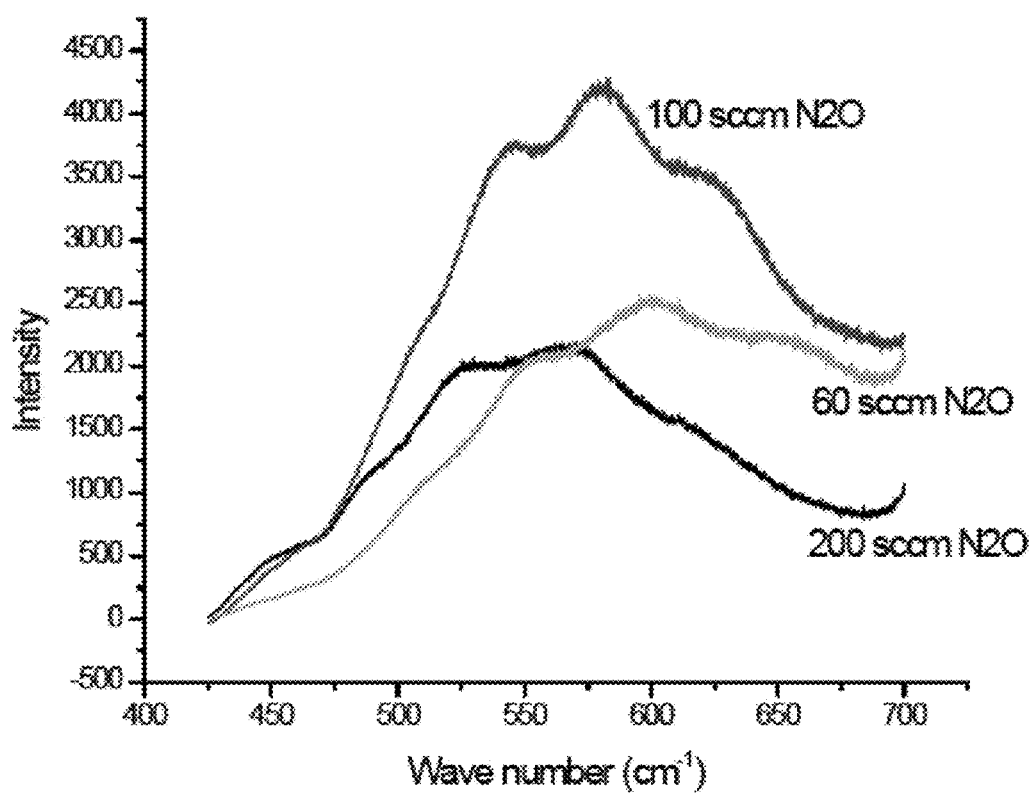
FIG. 16 depicts the photoluminescence spectra of the SiCON coatings prepared using different nitrous oxide ($N_2O$) flow rates during PECVD deposition.

FIG. 16 shows the photoluminescence of the samples prepared by injecting $N_2O$ at different flow rates during PECVD. The peak positions of the fluorescent spectra move to higher wave numbers for samples deposited using lower flows of $N_2O$ during PECVD.

The results of this study demonstrated that the PL spectrum of the SiCON coating could be varied using variations in the rate of $N_2O$ supplied during PECVD deposition. With variable PL peak position, the SiCON coating is suitable for photonic devices.

Example 11

Figure 17:
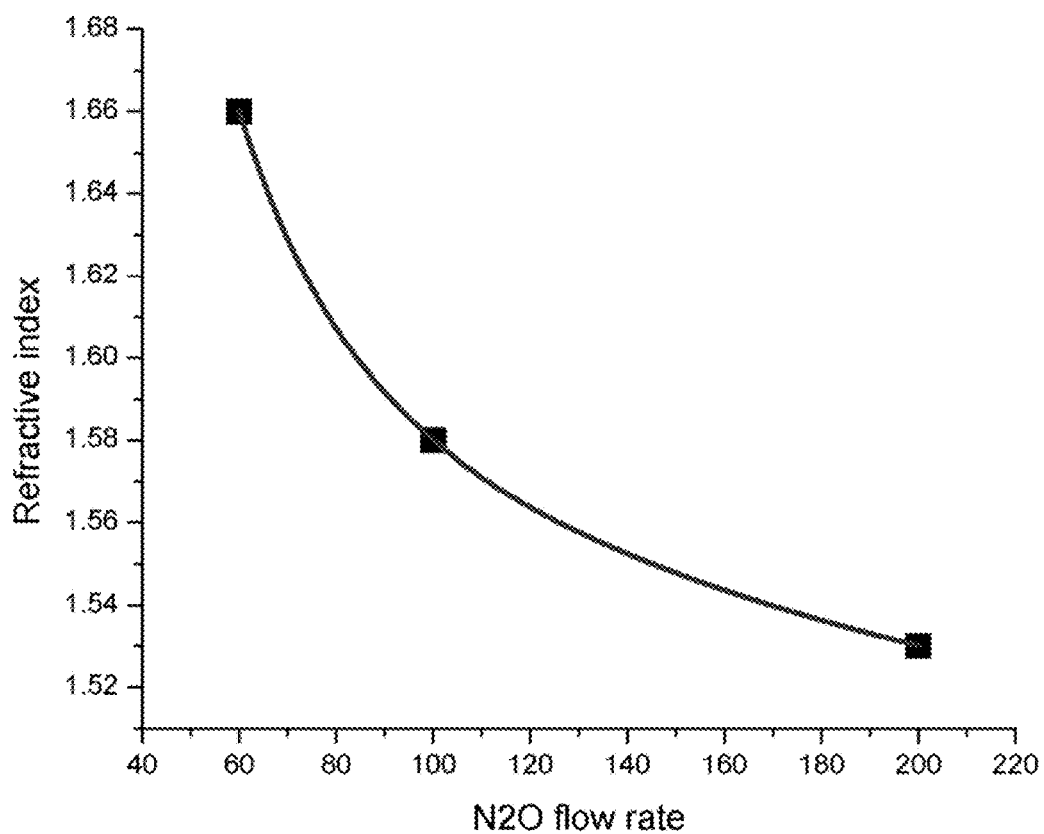
FIG. 17 depicts refractive index of the SiCON coating as a function of $N_2O$ flow rates used during PECVD deposition.

The Effect of the Rate of Nitrous Oxide Supplied During the Deposition of SiCON Coating on the Refractive Index of the Coating was Determined To determine the effect of the rate of nitrous oxide supply during the PECVD deposition of SiCON coating on the refractive index of the coatings, the following study was conducted. SiCON coatings were deposited on p-Si using the PECVD methods described in Example 1. $N_2O$ flow rate was varied to control different properties of the material. The different flow rates of $N_2O$ that were used in this experiment were 200 sccm, 100 sccm and 60 sccm while other deposition parameters were kept constant. FIG. 17 shows the refractive index as a function of nitrogen flow rate. Refractive index increased from 1.52 to 1.66 when $N_2O$ flow rate decreased from 200 sccm to 60 sccm during PECVD deposition of the coating.

The results of this study demonstrated that the refractive index of the SiCON coating varied as a function of the rate of $N_2O$ supplied during PECVD deposition. The more $N_2O$ that was supplied during coating deposition, the lower the refractive index of the coating. With this variable refractive index, the SiCON coating can be used as an antireflective coating for the entire visible light range.

Example 12

The Effect of the Rate of Nitrous Oxide Supplied During the Deposition of SiCON Coating on the Atomic Percentages of the Coating was Determined To determine the effect of the rate of nitrous oxide supply during the PECVD deposition of SiCON coating on the molecular content, the following study was conducted. SiCON coatings were deposited on p-Si substrate using the PECVD methods described in Example 1. $N_2O$ flow rate was varied during the deposition of the coating. The flow rates of $N_2O$ that were used in this experiment were 200 sccm, 100 sccm and 60 sccm while other deposition parameters were kept constant.

EDS was performed on the coating samples to determine the percentage of each element in the coating. EDS data is summarized in Table 3 for the three different coatings prepared with different $N_2O$ flow rates. Table 3 indicates that the carbon and Si content of all three coatings are comparable. The oxygen content of the coatings was lower with reduced $N_2O$ flow. The atomic number of hydrogen was too low to be measured using EDS methods.

TABLE 2

The Effect of Nitrous Oxide During Deposition on the Composition of the SiCON Coating

| $N_2O$ Flow Rate During Deposition | Atomic % | | | |
|---|---|---|---|---|
| | Si | C | O | N |
| 200 | 17.11 | 16.74 | 59.87 | 6.28 |
| 100 | 16.97 | 28.23 | 47.37 | 7.42 |
| 60 | 24.95 | 35.46 | 32.71 | 6.88 |

The results of this study demonstrated that the composition of the SiCON coating may be controlled by variations in the amount of $N_2O$ supplied during the PECVD deposition.

Example 13

The Effect of Deposition Conditions on the Hydrophobicity of the SiCON Coating was Determined To determine the effects of changes in deposition conditions on the hydrophobic properties of the resulting SiCON coating, the following study was conducted. SiCON coatings were deposited on p-Si substrates using the PECVD methods and conditions described in Example 1, except as described below. The hydrophobicities of the coatings were determined by measuring the water contact angle of deionized water droplets on the surface of the coatings from photographs.

Water contact angle of the coating deposited with 200 sccm $N_2O$ was calculated to be around 10°, indicating that the coating was hydrophilic. The hydrophilic properties of the coating were reduced by the addition of 100 sccm of $CF_4$ in the deposition chamber during deposition. After adding $CF_4$ the contact angle increased to around 30°. $SiH_4$ and $CH_4$ flow rates were further varied to manipulate the hydrophobicity of the SiCON coating, resulting in a maximum water contact angle of around 95°.

The results of this study demonstrated that the SiCON coating can be made hydrophilic and hydrophobic by variations in the PECVD deposition conditions. This property of the coating makes SiCON a material suitable for coating window glass, windshield, and other glass materials in which a scratch resistant and hydrophilic/hydrophobic coating is desired.

Example 14

The Properties of the SiCON Coating Were Compared to a-Si and SiC Coatings

To compare the properties of the SiCON coating with other commonly used coatings, the following study was conducted. Using the PECVD methods described in Example 1, SiCON, $SiO_2$ and a-SiC coatings were deposited at 100° C. for 5 minutes on p-Si substrates. Table 2 shows the deposition conditions used for the three coatings, the coating thickness achieved during the five minutes of deposition, and the corresponding deposition rate. All three coatings were deposited using identical flow rates for $SiH_4$ and $H_2$. For $SiO_2$ deposition $N_2O$ was introduced to the deposition chamber in addition to the other two gases. For a-SiC deposition, $CH_4$ was introduced instead of $N_2O$. For SiCON deposition both $N_2O$ and $CH_4$ were introduced simultaneously in the deposition chamber along with $SiH_4$ and $H_2$. The deposition rates listed in Table 1 indicate that the deposition rate of the SiCON coating was much higher than the $SiO_2$ or a-SiC coatings.

TABLE 3

PECVD Conditions for Three Coatings

| Coating Material | Gases in Deposition Chamber | Gas Flow Rate (sccm) | Coating Thickness (nm) | Deposition rate (nm/min) | Hardness (GPa) | Breakdown Field (MV/cm) |
|---|---|---|---|---|---|---|
| $SiO_2$ | $SiH_4$ | 15 | 550 | 110 | 6.88 | 3.8 |
| | $H_2$ | 1800 | | | | |
| | $N_2O$ | 200 | | | | |
| a-SiC | $SiH_4$ | 15 | 800 | 160 | 4.75 | 1.75 |
| | $H_2$ | 1800 | | | | |
| | $CH_4$ | 300 | | | | |
| SiCON | $SiH_4$ | 15 | 1080 | 216 | 10.9 | 6.5 |
| | $H_2$ | 1800 | | | | |
| | $CH_4$ | 300 | | | | |
| | $N_2O$ | 200 | | | | |

Hardness of the all three coatings was measured by performing nano-indentation in an AFM system. The a-SiC coating had the lowest (4.75 GPa) hardness value of all the coatings, the $SiO_2$ coating had an intermediate (6.88 GPa) hardness value, and the SiCON exhibited the highest hardness value (10.9 GPa) of any of the coatings tested.

Voltages were applied and the induced currents for all three coatings were measured. The breakdown fields for the three coatings were determined using the measured I-V characteristic curves. The breakdown field of the $SiO_2$ coating was 3.8 MV/cm, and was similar to previously measured values. The a-SiC coating had a breakdown field of 1.75 MV/cm, in agreement with previously measured values. For the SiCON coating, the breakdown strength was higher than either of the other two coatings, with a value of 6.5 MV/cm.

The roughness of the three coatings was calculated from AFM images. The a-SiC had the smoothest surface of all three coatings with a roughness value of 0.25 nm. The $SiO_2$ coating had an intermediate had an intermediate roughness value of 0.6 nm. The SiCON coating had the roughest surface of any of the three coatings, with a roughness value of 1.2 nm.

The results of this study indicated that the nanocomposite structure of the SiCON coating exhibited properties that were markedly different than either the $SiO_2$, or the a-SiC coatings. The deposition rate of the SiCON coating was higher than either of the other two coatings. Although $SiO_2$ and a-SiC deposition conditions were combined to determine the SiCON deposition conditions, the hardness value and breakdown field of the SiCON coating was higher than either of the other coatings. The combination of high breakdown field and hardness of the SiCON coating make it suitable for use as a hard dielectric coating that provides electrical insulation for very high voltages.

Example 15

SiCON Coating Enhanced Dielectric Breakdown Voltage of a Porous Polymer Coating

To assess the effect of the SiCON coating on the dielectric properties of a poly-paraxylene coating, the following study was conducted.

Poly-paraxylene was deposited on a heavily doped Si substrate using a process of chemical vapor deposition. Powdered [2,2]paracyclophane dimer was vaporized at a temperature of approximately 120° C.-180° C., and then heated to approximately 650° C.-700° C. to convert the vaporized dimers into vaporized monomers. The vaporized monomers were drawn into the deposition chamber, which contained the heavily doped Si substrate at room temperature. The resulting poly-paraxylene coating was about 8 microns thick.

One coated substrate was retained as a sample, and the exposed poly-paraxylene of another coated substrate was coated with a SiCON coating with a thickness of about 200 nm, using the PECVD methods described in Example 1. A metal contact was used to assess the breakdown voltage of the two samples. Table 4 summarizes the breakdown voltages measured for the two samples. The addition of a 200-nm SiCON coating more than tripled the breakdown voltage of the poly-paraxylene coating, probably due in part to filling of voids in the poly-paraxylene material by the SiCON material.

TABLE 4

Breakdown Voltage Summary

| Sample | Poly-paraxylene coating thickness | SiCON coating thickness | Breakdown Voltage |
|---|---|---|---|
| 1 | 8 micron | — | 800 V |
| 2 | 8 micron | 200 nm | >2700 V |

The results of this experiment demonstrated that a SiCON coating enhances the dielectric properties of poly-paraxylene coating material.

Example 16

The Effects of Process Parameters on the Hardness of SiCON Coatings was Assessed To assess the hardness of SiCON coating prepared using two different deposition temperatures and two different combinations of gas sources, the following study was conducted. Four sample surfaces were coated with a SiCON coating using the CVD method described in Example 1 and the surface temperatures and gas sources summarized in Table 5.

TABLE 5

Process Parameters for SiCON Coatings

| Sample | Surface Temperature (° C.) | Source Gases | | | |
|---|---|---|---|---|---|
| | | $Si(CH_4)_4$ | $SiH_4$ | $N_2O$ | $H_2$ |
| 1 | 100 | Y | N | Y | Y |
| 2 | 100 | N | Y | Y | Y |
| 3 | 400 | Y | N | Y | Y |
| 4 | 400 | N | Y | Y | Y |

The hardness of each of the sample surfaces was measured using a Continuous Stiffness Measurement (CSM) technique performed using a Nano Indenter G200 nanomechanics system (Agilent Technologies, Indianapolis, Ind., USA) equipped with a standard XP head. Hardness of the four samples was monitored continuously as the indenter penetrated each sample surface to evaluate trends in the nanomechanical properties as a function of depth. 15 indentations were performed on each sample and the loading of each indentation was controlled such that the loading rate divided by the load was held constant at 0.05/sec. Each indentation was terminated at a depth of approximately 500 nm.

Figure 18:
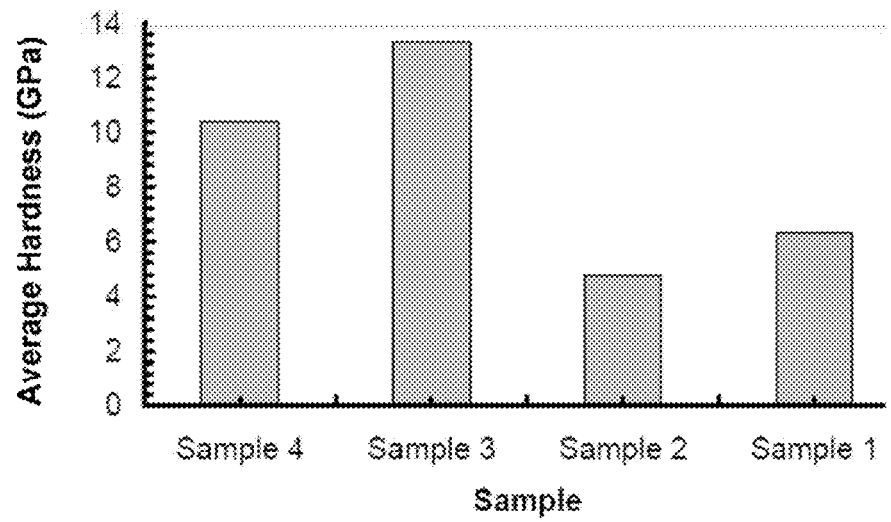
FIG. 18 depicts average hardness of four SiCON coatings as a function of penetration depth.
Figure 19:
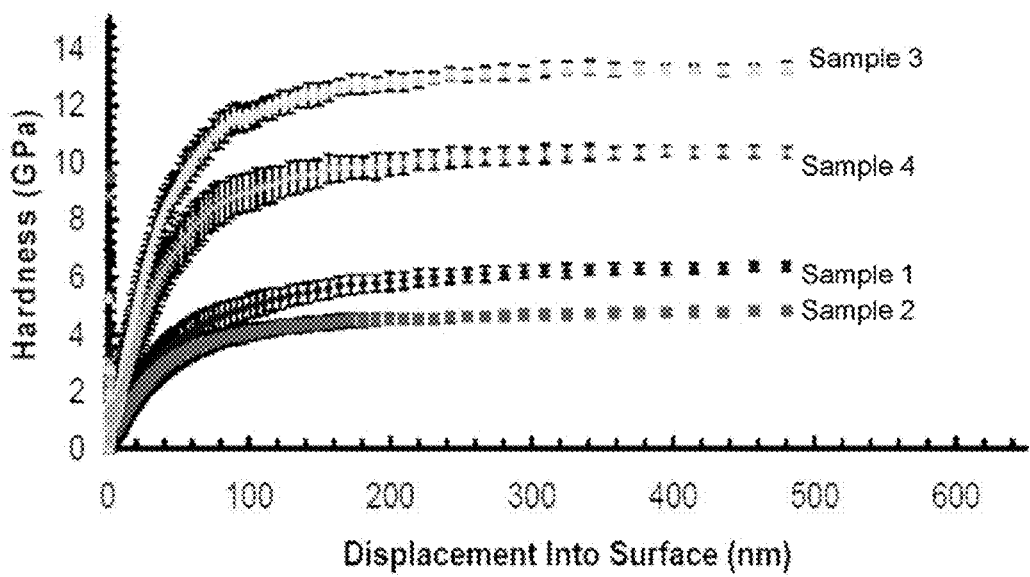
FIG. 19 depicts the average hardness of four SiCON coatings as a function of displacement into the surface.

The average hardness measured for each of the four sample is summarized in FIG. 18. The average hardness measured at each indentation depth for each of the four samples is summarized in FIG. 19. Samples 3 and 4, which were prepared at 400° C., had maximum hardnesses of about 10 GPa and 13 GPa, respectively, while samples 1 and 2, prepared at a temperature of 100° C., both had maximum hardnesses of less than 6 GPa. Within each pair of samples prepared at the same temperature, the samples prepared using $Si(CH_4)_4$ as the silicon source had higher maximum surface hardnesses.

The results of this study demonstrated that the surface temperature at which the SiCON surface is deposited had a significant effect on the hardness of the resulting coating surface. In addition, the hardness of the SiCON coating was sensitive to the gas source used to supply silicon to the CVD process.

Example 17

The Feasibility of the SiCON Coating as a Dielectric in a Nuclear Battery was Assessed To assess the feasibility of using a SiCON coating to fabricate a nuclear battery, the following study was conducted. SiCON was coated onto 2-inch diameter metal substrates using the CVD process described in Example 1. Three different coated metal substrates were formed, having SiCON coating thickness of 1 micron, 5 microns, and 10 microns, respectively. A 1-inch diameter aluminum foil sheet was placed on top of each SiCON coating, and a Pm-147 radioactive energy source was placed on top of each aluminum foil sheet. The Pm-147 energy source had an activity of 0.02 Ci and an efficiency of source of 0.08.

Figure 21:
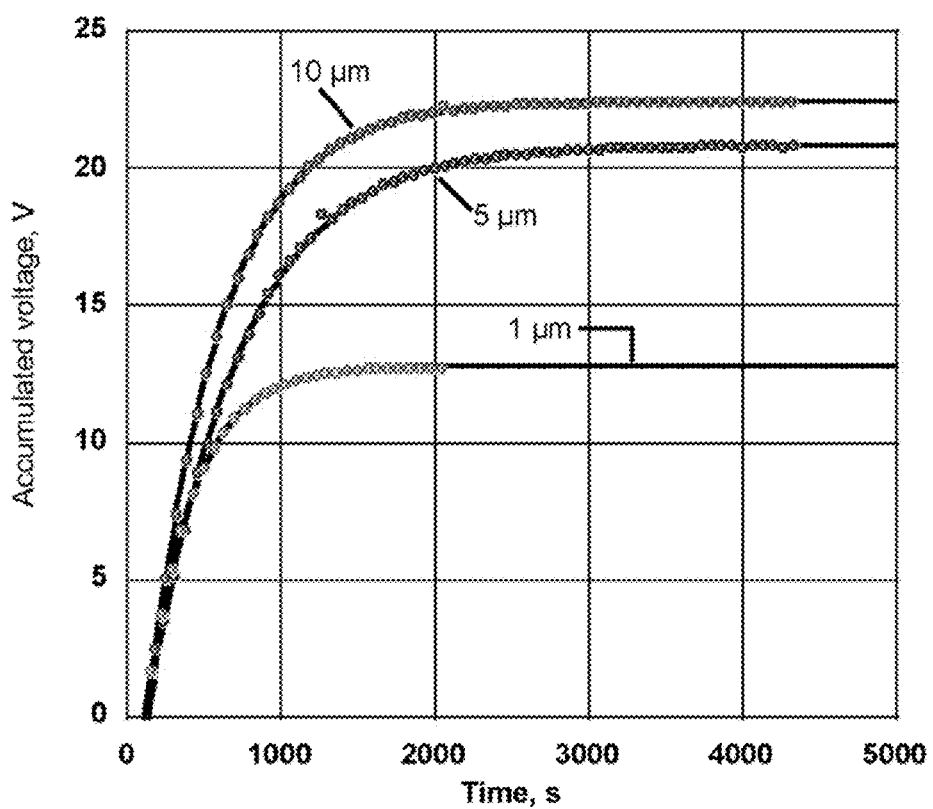
FIG. 21 depicts accumulated voltages of three nuclear batteries having three different thicknesses of SiCON dielectric layers as a function of time.

FIG. 21 shows the accumulated voltage as a function of elapsed time for each of the nuclear batteries having the different SiCON coating thicknesses. The accumulated voltage increased as a non-linear function of the thickness of the SiCON dielectric layer of the nuclear battery. Although the accumulated voltage increased significantly between the 1-micron-thick dielectric layer and the 5-micron-thick dielectric layer, the accumulated voltage was only slightly higher with a 10 micron-thick dielectric layer.

Figure 20:
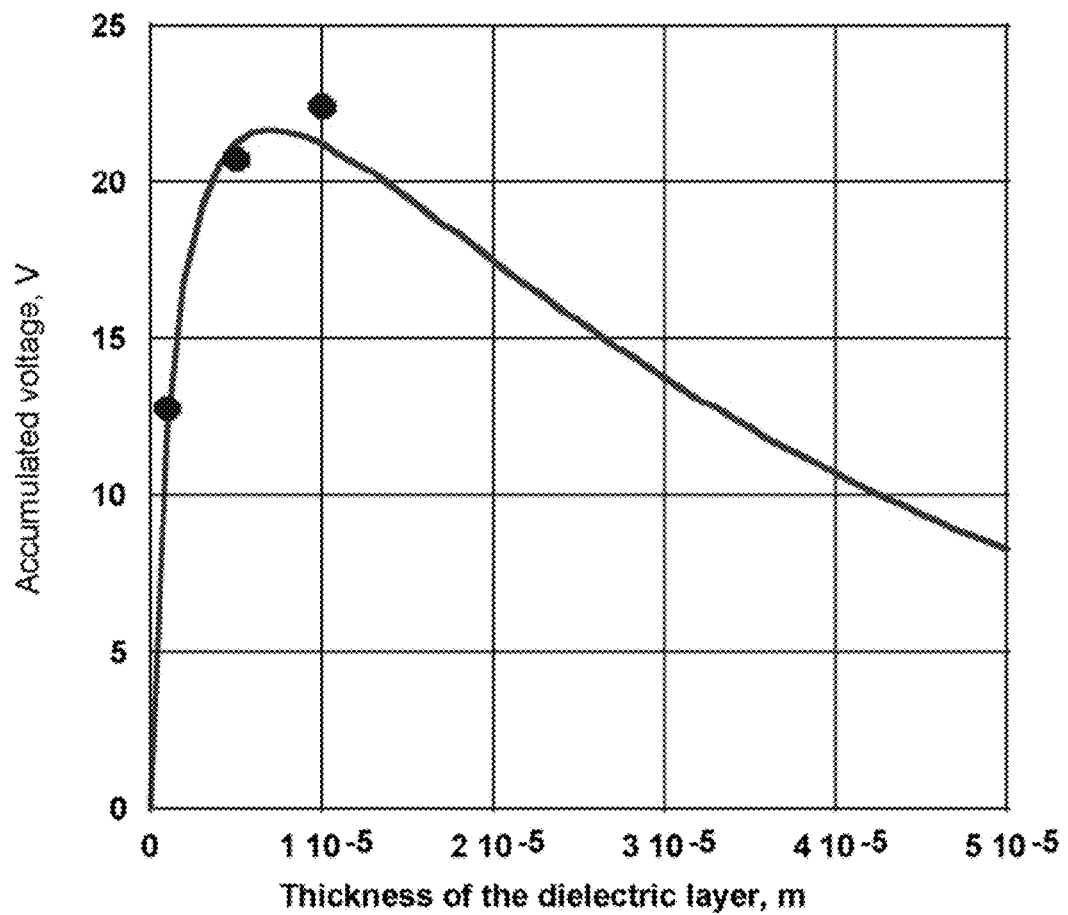
FIG. 20 depicts the accumulated voltages of three nuclear batteries having three different thicknesses of SiCON dielectric layers as a function of dielectric layer thickness.

FIG. 20 is a summary of the maximum accumulated voltage for the three nuclear batteries as a function of the SiCON dielectric layer thicknesses. In addition, FIG. 20 shows a theoretical estimate of the maximum voltage as a function of the dielectric layer thickness, indicating that the maximum voltage decreased for nuclear batteries having thicker dielectric layers, all other factors being equal.

The results of this study demonstrated that the SiCON layer was sufficiently radiation hardened, and possessed suitable dielectric properties for use as a dielectric layer in a nuclear battery.

Example 18

The Resistance of the SiCON Surface to Chemical Degradation was Assessed

To assess the resistance of the SiCON coating to chemical degradation, the following test was conducted. SiCON was coated onto a substrate using the CVD process described in Example 1. The coated substrates were immersed in hydrogen peroxide for about 36 hours. Another set of coated substrates was immersed in gun oil for about 48 hours. The immersion in hydrogen peroxide and gun oil did not change the water contact angle of the SiCON surface, which was about 80 degrees both before and after being stored in hydrogen peroxide and gun oil. The results of this study indicated that the SiCON surface was resistant to chemical degradation.

Example 19

The Resistance of the SiCON Surface to Abrasion was Assessed

To assess the resistance of the SiCON coating to abrasion, the following test was conducted. SiCON was coated onto substrates using the CVD process described in Example 1. The coated substrates were scratched a total of 1000 times using a metal brush mounted in an abrasion-testing device. The abrasion of the SiCON surface using a metal brush did not change the water contact angle of the SiCON surface, which was about 80 degrees both before and after the abrasion. The results of this study indicated that the SiCON surface was resistant to physical abrasion.

What is claimed is:

1. A nanocomposite coating material deposited on the surface of a substrate, the nanocomposite coating material consisting of nanostructures embedded in an amorphous silicon oxide matrix, wherein:
the nanostructures range from about 10 nm to about 25 nm in size;
the nanostructures consist of materials selected from the list comprising amorphous SiC, amorphous $SiO_2$, amorphous carbon, amorphous CN, nanocrystalline SiC, nanocrystalline carbon, nanocrystalline CN, and combinations thereof; and
the amorphous silicon oxide matrix consists of amorphous silicon oxide containing between about 1 atomic % and about 20 atomic % of nitrogen and less than 1 atomic percent hydrogen.

2. The coating material of claim 1, wherein the substrate is selected from the group consisting of quartz, glass, silicon, stainless steel, plastic, aluminum, titanium, germanium, polyethylene terephtalate, a hydrogel, a zeolite, an aerogel, a xerogel, an ambigel, a ceramic, a polymer, silicon dioxide, silicon carbide, silicon carboxide, aluminum oxide, gallium nitride, gallium arsenide, indium tin oxide, titanium oxide, lead oxide, lead sulfide, lead selenide, lead telluride, a transition metal oxide, a lanthanide oxide, a transition metal chalcogenide, a transition metal chalcogenide alloy, a lanthanide chalcogenide, and mixtures thereof.

3. The nanocomposite coating material of claim 1, wherein the nanocomposite coating material has a breakdown field ranging from about 3 MV/cm to about 8 MV/cm.

4. The nanocomposite coating material of claim 1, wherein the nanocomposite coating material is substantially crack-free when applied to the substrate at a thickness of up to about 50 μm.

5. The nanocomposite coating material of claim 1, wherein the nanocomposite coating material is non-porous and scratch-resistant.

6. The nanocomposite coating material of claim 1, wherein the nanocomposite coating material has a hardness ranging from about 4 GPa to about 14 GPa.

7. The nanocomposite coating material of claim 1, wherein the nanocomposite coating material fluoresces when excited by ultra violet light.

8. The nanocomposite coating material of claim 1, wherein the nanocomposite coating material has a refractive index ranging from about 1.4 to about 1.8.

9. The nanocomposite coating material of claim 1, wherein the nanocomposite coating material has a dielectric constant ranging from about 5 to about 6.

10. The nanocomposite coating material of claim 1, wherein the nanocomposite coating is included in a device selected from the group consisting of surgical instruments, aircraft windshields, automobile windshields, optical devices, eyeglass lenses, window glass, laboratory glassware, semiconductors, MOSCAP devices, thin-film electrical insulators, light-emitting diodes, extremely small-scale capacitors, high breakdown voltage capacitors, dental brackets, bearings, electronic devices, high energy density capacitors, scratch-resistant plastic parts, scratch-resistant faucets, scratch-resistant shower heads, nuclear batteries, drill bits, milling machine heads, and milling machine cutters.

\* \* \* \* \*